United States Patent
Park

(10) Patent No.: US 12,347,502 B2
(45) Date of Patent: Jul. 1, 2025

(54) PAGE BUFFER, MEMORY DEVICE INCLUDING PAGE BUFFER AND MEMORY SYSTEM INCLUDING MEMORY DEVICE

(71) Applicant: SK hynix Inc., Icheon-si (KR)

(72) Inventor: Kang Woo Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 135 days.

(21) Appl. No.: 18/321,576

(22) Filed: May 22, 2023

(65) Prior Publication Data

US 2024/0177786 A1    May 30, 2024

(30) Foreign Application Priority Data

Nov. 30, 2022   (KR) .................. 10-2022-0164302

(51) Int. Cl.
  *G11C 16/34*    (2006.01)
  *G11C 16/10*    (2006.01)
  *G11C 16/26*    (2006.01)

(52) U.S. Cl.
  CPC ........ *G11C 16/3459* (2013.01); *G11C 16/102* (2013.01); *G11C 16/26* (2013.01)

(58) Field of Classification Search
  CPC .... G11C 16/3459; G11C 16/102; G11C 16/26
  See application file for complete search history.

(56) References Cited

U.S. PATENT DOCUMENTS

2021/0201963 A1*  7/2021  Chun ............... G11C 13/004
2021/0216396 A1*  7/2021  Xu ..................... G06F 3/0689

FOREIGN PATENT DOCUMENTS

KR   1020150090369 A   8/2015
KR   1020160012300 A   2/2016

* cited by examiner

*Primary Examiner* — Han Yang
(74) *Attorney, Agent, or Firm* — WILLIAM PARK & ASSOCIATES LTD.

(57) ABSTRACT

A memory device including a page buffer is part of a memory system. The memory device includes first memory cells, each configured to be programmed to have a threshold voltage corresponding to any one of a plurality of program states. The memory device also includes data latches configured to respectively store a plurality of pieces of first logical page data to be stored in the first memory cells. The memory device further includes a pre-sensing latch configured to store data sensed through a pre-verify operation. The pre-sensing latch stores second logical page data to be stored in second memory cells when a main verify operation for a threshold program state, among the plurality of program states, has passed.

30 Claims, 19 Drawing Sheets

FIG. 8

Program Order

| WL | Local WL | Page | Inter PGM | Final PGM |
|---|---|---|---|---|
| WL1 | LWL11 | PG1 | 1 | 6 |
| | LWL12 | PG2 | 2 | 8 |
| | LWL13 | PG3 | 3 | 10 |
| | LWL14 | PG4 | 4 | 12 |
| WL2 | LWL21 | PG5 | 5 | 14 |
| | LWL22 | PG6 | 7 | 16 |
| | LWL23 | PG7 | 9 | 18 |
| | LWL24 | PG8 | 11 | 20 |
| WL3 | LWL31 | PG9 | 13 | 21 |
| | LWL32 | PG10 | 15 | 22 |
| | LWL33 | PG11 | 17 | 23 |
| | LWL34 | PG12 | 19 | 24 |

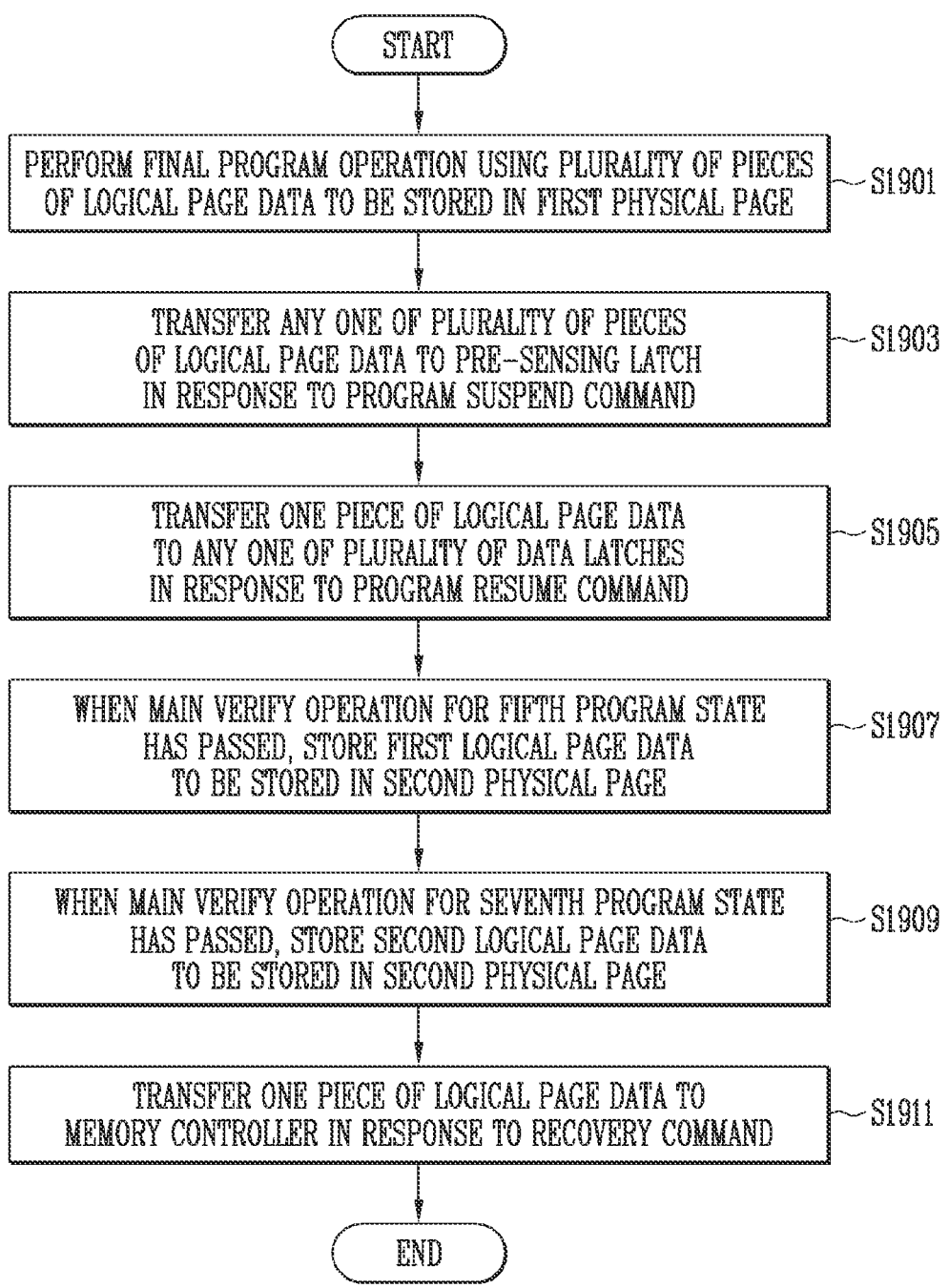

PAGE BUFFER, MEMORY DEVICE INCLUDING PAGE BUFFER AND MEMORY SYSTEM INCLUDING MEMORY DEVICE

CROSS-REFERENCE TO RELATED APPLICATION

The present application claims priority under 35 U.S.C. § 119(a) to Korean patent application number 10-2022-0164302 filed on Nov. 30, 2022, in the Korean Intellectual Property Office, the entire disclosure of which is incorporated by reference herein.

BACKGROUND

1. Technical Field

Various embodiments of the present disclosure relate to an electronic device, and more particularly to a page buffer, a memory device including the page buffer, and a memory system including the memory device.

2. Related Art

A memory system is a system which stores data under the control of a host device such as a computer or a smartphone. The memory system may include a memory device in which data is stored and a memory controller which controls the memory device. A memory device is classified as a volatile memory device or a nonvolatile memory device.

A nonvolatile memory device is a memory device in which stored data is retained even when the supply of power is interrupted. A nonvolatile memory device may include, for example, read only memory (ROM), programmable ROM (PROM), electrically programmable ROM (EPROM), electrically erasable and programmable ROM (EEPROM), or flash memory.

A nonvolatile memory device performs a program operation to store data. A program operation may be performed by changing the threshold voltages of memory cells included in the nonvolatile memory device. When memory cells do not have threshold voltages corresponding to data to be stored, the program operation may fail. When the program operation fails, a reprogram operation may be performed again using the data to be stored in memory cells. To prepare for a possible failed program operation, data to be stored in the memory cells is not discarded until the program operation is successfully completed. The data to be stored in the memory cells may be stored in a memory controller or a nonvolatile memory device until the program operation is successfully completed.

SUMMARY

Various embodiments of the present disclosure are directed to a page buffer capable of recovering data required for a reprogram operation when a program operation has failed, a memory device including the page buffer, and a memory system including the memory device.

In accordance with an embodiment of the present disclosure is a memory device. The memory device may include first memory cells, each configured to be programmed to have a threshold voltage corresponding to any one of a plurality of program states, data latches configured to respectively store a plurality of pieces of first logical page data to be stored in the first memory cells, and a pre-sensing latch configured to store data sensed through a pre-verify operation. The pre-sensing latch may store second logical page data to be stored in second memory cells when a main verify operation for a threshold program state, among the plurality of program states, has passed.

In accordance with an embodiment of the present disclosure is a memory device. The memory device may include a memory block including a first physical page and a second physical page, data latches configured to respectively store a plurality of pieces of first logical page data to be stored in the first physical page, and a cache latch configured to store second logical page data to be stored in the second physical page. Any one of the data latches may be configured to, when a program operation of storing the plurality of pieces of first logical page data in the first physical page has failed, provide any one of the plurality of pieces of first logical page data to an external memory controller.

In accordance with an embodiment of the present disclosure is a memory system. The memory system may include a memory device including a first physical page and a second physical page, and a memory controller configured to provide a plurality of pieces of first logical page data to be stored in the first physical page and second logical page data to be stored in the second physical page, and thereafter obtain any one of the plurality of pieces of first logical page data from the memory device in response to a failure of a program operation.

In accordance with an embodiment of the present disclosure is a page buffer. The page buffer may include data latches configured to respectively store a plurality of pieces of first logical page data to be stored in a first physical page, a main sensing latch configured to store result information of a main verify operation, and a pre-sensing latch configured to store result information of a pre-verify operation. In response to a program suspend command, any one of the data latches may transfer any one of the plurality of pieces of first logical page data to the pre-sensing latch, and the main sensing latch may reflect the result information of the main verify operation in the plurality of pieces of first logical page data and stores data sensed through a read operation.

BRIEF DESCRIPTION OF THE DRAWINGS

FIG. 8 is a diagram illustrating an order of a program operation of a memory device.

FIG. 19 is a flowchart illustrating an embodiment of a program suspend operation, a resume operation, and a cache program operation of a memory device.

DETAILED DESCRIPTION

Specific structural or functional descriptions in the embodiments of the present disclosure introduced in this specification or application are provided as examples to describe embodiments according to the concept of the present disclosure. Embodiments according to the concept of the present disclosure may be practiced in various forms, and should not be construed as being limited to the embodiments described in the specification or application.

Figure 1:
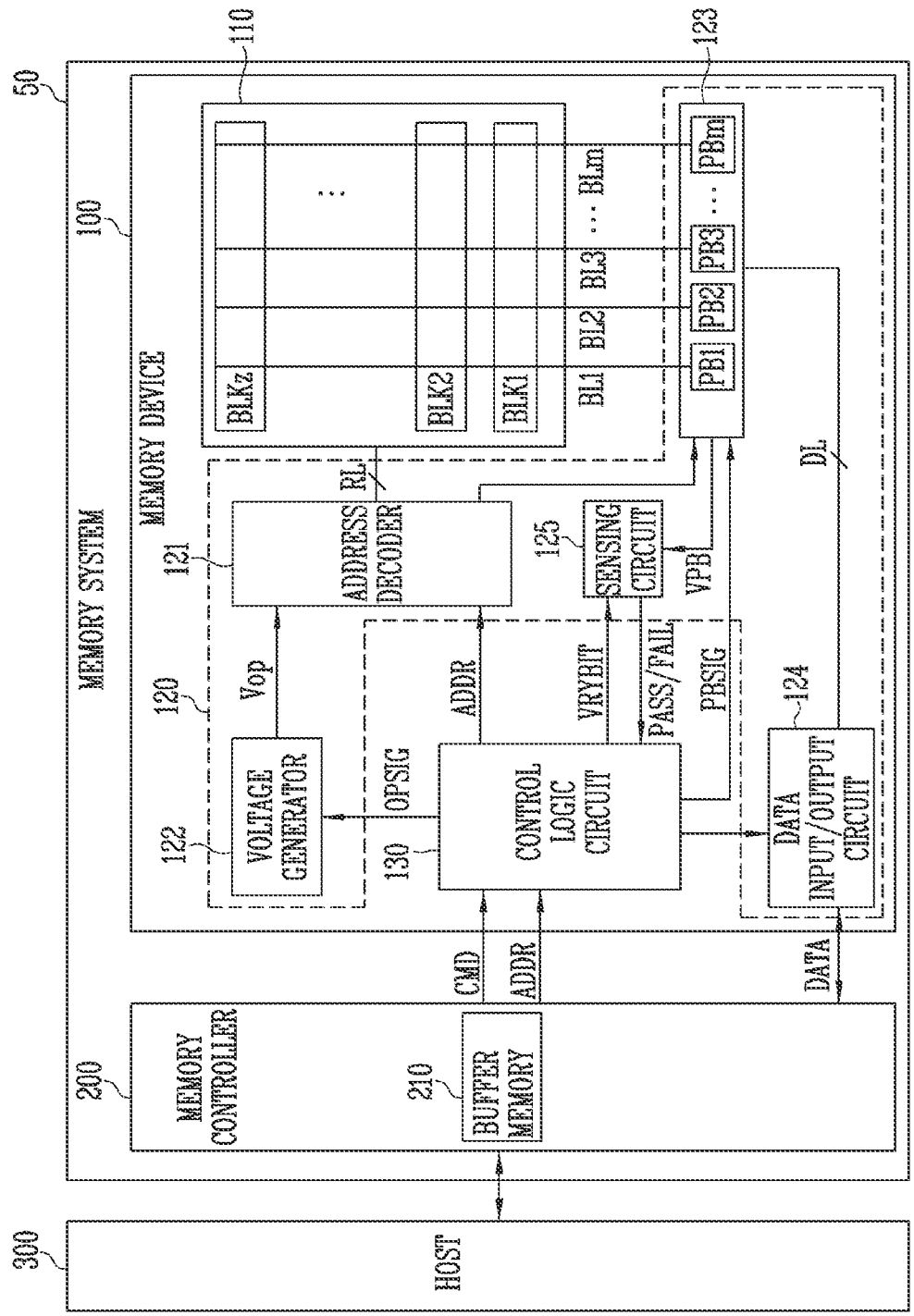
FIG. 1 is a diagram illustrating a memory system including a memory device and a memory controller.

FIG. 1 is a diagram illustrating a memory system including a memory device and a memory controller.

Referring to FIG. 1, a memory system 50 may include a memory device 100 and a memory controller 200. The memory system 50 may be a device that is included in a mobile phone, a computer, an in-vehicle infotainment system, or the like and that stores data under the control of a host 300 which is an external device.

In an embodiment, the memory system 50 may be manufactured as any one of various types of storage devices depending on a host interface that is a scheme for communication with the host 300. In an embodiment, the memory system 50 may be manufactured in any one of various types of package forms.

The memory device 100 may store data. The memory device 100 may be operated under the control of the memory controller 200. In an embodiment, the memory device 100 may be a volatile memory device or a nonvolatile memory device.

The memory device 100 may receive a command CMD and an address ADDR from the memory controller 200, and may access an area selected by the address ADDR. The memory device 100 may perform a program operation of writing data to the area selected by the address ADDR, a read operation of reading data, or an erase operation of erasing data.

The memory controller 200 may control the overall operation of the memory system 50.

When power is applied to the memory system 50, the memory controller 200 may run firmware (FW). In an embodiment, the memory controller 200 may control communication between the host 300 and the memory device 100 by running the firmware.

The memory controller 200 may control the memory device 100 so that a program operation, a read operation, or an erase operation is performed in response to a request received from the host 300. The memory controller 200 may provide the command CMD, the address ADDR, or data to the memory device 100 based on a program operation, a read operation, or an erase operation.

In an embodiment, the memory controller 200 may internally generate a command, an address, and data regardless of whether a request from the host 300 is received, and may transmit them to the memory device 100. For example, the memory controller 200 may provide the memory device 100 with commands, addresses, and data required to perform read operations and program operations that are involved in performing wear leveling, read reclaim, garbage collection, etc.

In an embodiment, the memory controller 200 may include buffer memory 210. The buffer memory 210 may temporarily store data provided from the host 300, or may temporarily store data read from the memory device 100. In an embodiment, the buffer memory 210 may store metadata. The metadata may be data including information used to operate the memory system 50. In an embodiment, the metadata may include map data including a corresponding relationship between logical addresses of the host 300 and physical addresses of the memory device 100.

In an embodiment, the buffer memory 210 may be a volatile memory device. For example, the buffer memory 210 may be a static random-access memory (SRAM). In an embodiment, the buffer memory 210 may be located outside the memory controller 200 or may be located inside the memory controller 200. In an embodiment, the buffer memory 210 may be located outside the memory system 50.

In an embodiment, the buffer memory 210 may temporarily store data corresponding to a write request received from the host 300. Also, the memory device 100 may perform a program operation of receiving data corresponding to the write request and storing the data in memory cells. However, when the data corresponding to the write request is not normally stored in the memory cells, the program operation may fail. When the program operation has failed, the memory device 100 may perform a reprogram operation of again receiving the data, corresponding to the write request and stored in the buffer memory 210, and storing the received data in the memory cells. The data corresponding to the write request may be stored in the buffer memory 210 until the program operation is terminated to prepare for failure of the program operation. However, when the data corresponding to the write request is stored in the memory device 100, the buffer memory 210 does not need to store data corresponding to the write request. In other words, when the data corresponding to the write request is stored in the memory device 100, the memory controller 200 may obtain the data corresponding to the write request from the memory device 100 even if the program operation has failed. Therefore, the buffer memory 210 may remove the data corresponding to the write request after the data corresponding to the write request is provided to the memory device 100.

The host 300 may communicate with the memory system 50 using at least one of various communication schemes.

In an embodiment, the memory device 100 may include a memory cell array 110, a peripheral circuit 120, and a control logic circuit 130.

The memory cell array 110 may include a plurality of memory blocks BLK1 to BLKz. The plurality of memory blocks BLK1 to BLKz may be coupled to an address decoder 121 through row lines RL. The plurality of memory blocks BLK1 to BLKz may be coupled to a page buffer group 123 through bit lines BL1 to BLm. Each of the memory blocks BLK1 to BLKz may include a plurality of memory cells.

Each of the memory cells may be implemented as a single-level cell (SLC) capable of storing one bit of data, a multi-level cell (MLC) capable of storing two bits of data, a triple-level cell (TLC) capable of storing three bits of data, a quad-level cell (QLC) capable of storing four bits of data, or a memory cell capable of storing five or more bits of data.

The peripheral circuit 120 may drive the memory cell array 110. In an example, the peripheral circuit 120 may drive the memory cell array 110 so that a program operation, a read operation, and an erase operation are performed under the control of the control logic circuit 130. In an example, the peripheral circuit 120 may apply various operating voltages to the row lines RL and the bit lines BL1 to BLm or discharge the applied voltages under the control of the control logic circuit 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, word lines, source selection lines, and a common source line.

The address decoder 121 may be operated in response to the control of the control logic circuit 130. The address decoder 121 may receive addresses ADDR from the control logic circuit 130.

The address decoder 121 may decode a block address, among the received addresses ADDR. The address decoder 121 may select at least one of the memory blocks BLK1 to BLKz according to the decoded block address. The address decoder 121 may decode a row address, among the received addresses ADDR. The address decoder 121 may select at least one word line WL of the selected memory block by applying voltages supplied from the voltage generator 122 to the at least one word line WL according to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to unselected word lines.

The address decoder 121 may decode a column address among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic circuit 130.

In an embodiment, the voltage generator 122 may generate various operating voltages Vop that are used for program, read, and erase operations in response to an operation signal OPSIG. For example, the voltage generator 122 may generate a plurality of erase voltages, a plurality of program voltages, a plurality of pass voltages, a plurality of select read voltages, and a plurality of unselect read voltages.

The generated operating voltages Vop may be supplied to the memory cell array 110 by the address decoder 121.

The page buffer group 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated under the control of the control logic circuit 130.

The first to m-th page buffers PB1 to PBm may transmit/receive data DATA to/from the data input/output circuit 124. During a program operation, the first to m-th page buffers PB1 to PBm may receive data DATA through the data input/output circuit 124 and data lines DL.

During a program operation, the first to m-th page buffers PB1 to PBm may transfer data DATA, received through the data input/output circuit 124, to selected memory cells through the bit lines BL1 to BLm. The memory cells in the selected page may be programmed based on the received data DATA. Memory cells coupled to a bit line to which a program-enable voltage (e.g., a ground voltage) is applied may have increased threshold voltages. The threshold voltages of memory cells coupled to a bit line to which a program-inhibit voltage (e.g., a supply voltage) is applied may be maintained. During a verify operation, the first to m-th page buffers PB1 to PBm may read the data DATA stored in the selected memory cells from the selected memory cells through the bit lines BL1 to BLm.

In an embodiment, while pieces of data stored in some of the plurality of page buffers included in the page buffer group 123 are being programmed to the memory cell array 110, the remaining page buffers may receive new data from the memory controller 200 and then store the new data.

The data input/output circuit 124 may be coupled to the first to m-th page buffers PB1 to PBm through the data lines DL. The data input/output circuit 124 may be operated under the control of the control logic circuit 130.

The data input/output circuit 124 may include a plurality of input/output buffers (not illustrated) which receive input data DATA. During a program operation, the data input/output circuit 124 may receive the data DATA to be stored from the memory controller 200.

During a verify operation, the sensing circuit 125 may generate a reference current in response to an enable bit signal VRYBIT generated by the control logic circuit 130, and may output a pass signal or a fail signal to the control logic circuit 130 by comparing a sensing voltage VPB received from the page buffer group 123 with a reference voltage generated by the reference current. In an example, the sensing circuit 125 may output a pass signal to the control logic circuit 130 when the magnitude of the sensing voltage VPB is greater than that of the reference voltage. In an example, the sensing circuit 125 may output a fail signal to the control logic circuit 130 when the magnitude of the sensing voltage VPB is less than that of the reference voltage.

The control logic circuit 130 may be coupled to the address decoder 121, the voltage generator 122, the page buffer group 123, the data input/output circuit 124, and the sensing circuit 125. The control logic circuit 130 may control the overall operation of the memory device 100. The control logic circuit 130 may be operated in response to the command CMD received from the memory controller 200.

The control logic circuit 130 may control the peripheral circuit 120 by generating various types of signals in response to the command CMD and the address ADDR. For example, the control logic circuit 130 may generate the operation signal OPSIG, the addresses ADDR, a page buffer control signal PBSIG, and the enable bit signal VRYBIT in response to the command CMD and the address ADDR. The control logic circuit 130 may output the operation signal OPSIG to the voltage generator 122, may output the addresses ADDR to the address decoder 121, may output the page buffer control signals PBSIG to the page buffer group 123, and may output the enable bit signal VRYBIT to the sensing circuit 125. In addition, the control logic circuit 130 may determine whether a verify operation has passed or failed in response to the pass or fail signal PASS or FAIL output from the sensing circuit 125.

In an embodiment, the control logic circuit 130 may control a program operation on the memory cells. In an embodiment, the program operation may include an intermediate program operation and a final program operation. The control logic circuit 130 may control the peripheral circuit 120 to perform the intermediate program operation and the final program operation on the memory cells.

In an embodiment, each of the page buffers PB1 to PBm included in the page buffer group 123 may include a plurality of latches. The plurality of latches may temporarily store data and information used for the program operation.

In an embodiment, the plurality of latches may store data to be stored in the memory cells until the program operation is terminated to prepare for failure of the program operation. For example, when each of the memory cells is programmed according to a TLC scheme, the plurality of latches may store three bits of data until the program is terminated. When program failure occurs, the plurality of latches may provide the data to be stored in the memory cells to the memory controller 200 so as to perform a reprogram operation.

Figure 2:
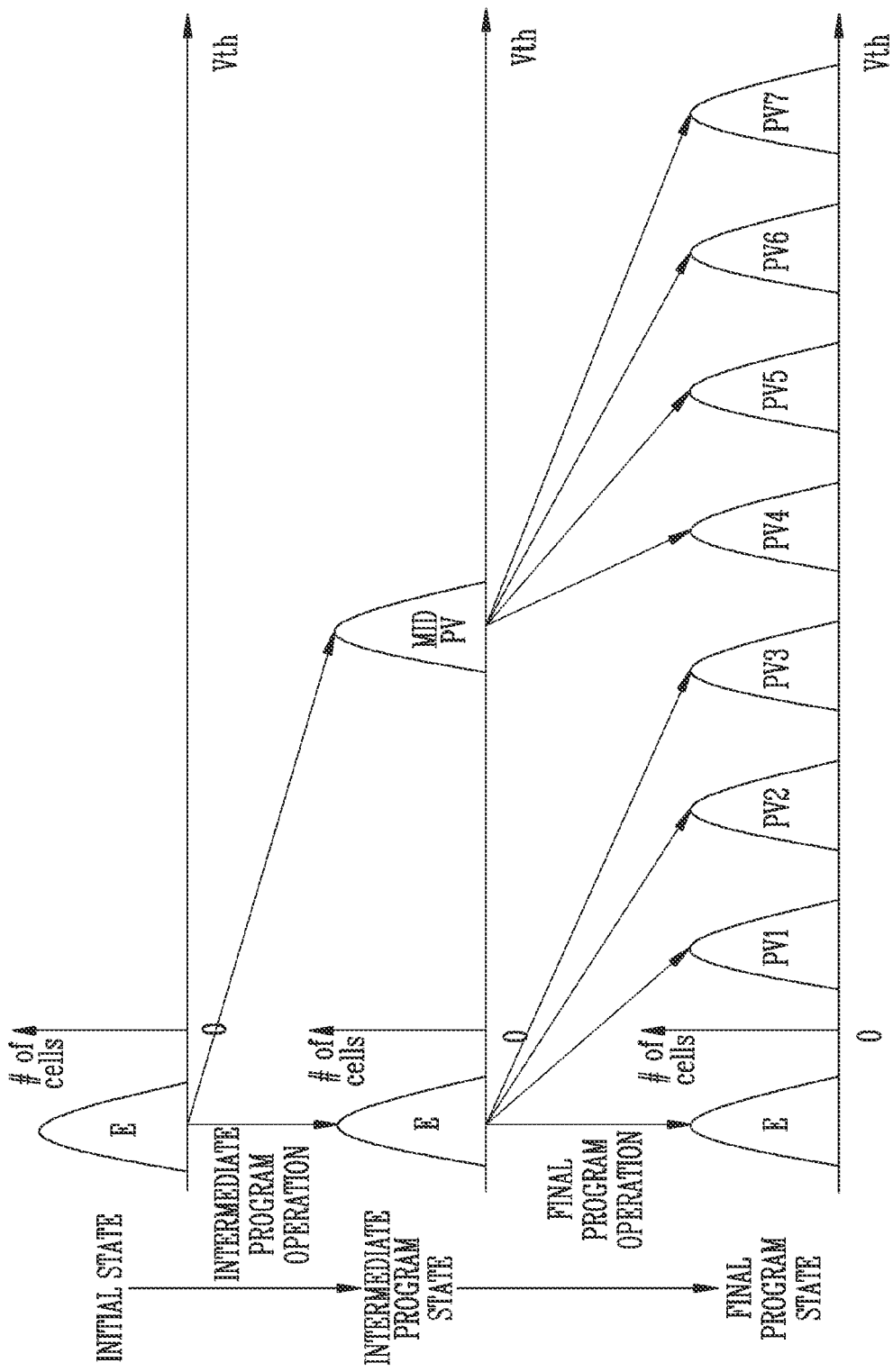
FIG. 2 is a diagram illustrating threshold voltage distributions of memory cells depending on a program operation of a memory device.

FIG. 2 is a diagram illustrating threshold voltage distributions of memory cells depending on a program operation of a memory device.

In FIG. 2, the horizontal axis of each graph indicates threshold voltages Vth of memory cells, and the vertical axis thereof indicates the number of memory cells (# of cells).

Referring to FIG. 2, the memory device 100 may perform a program operation on the memory cells. The program operation may include an intermediate program operation and a final program operation. Threshold voltage distributions of the memory cells may change from an initial state to an intermediate program state depending on the intermediate program operation, and may change from the intermediate program state to a final program state depending on the final program operation. The intermediate program operation may be an operation in which each of memory cells has a threshold voltage corresponding to any one of an erase state E or a middle state MID PV. The final program operation may be an operation in which each of the memory cells has a threshold voltage corresponding to a target program state.

The initial state may be the state in which a program operation is not performed and in which the threshold voltage distribution of the memory cells is in the erase state E.

The intermediate program state may be the program state of memory cells on which the intermediate program operation has been performed. Each of the memory cells may have a threshold voltage corresponding to any one of the erase state E or the middle state MID PV through the intermediate program operation. In an embodiment, the middle state MID PV may be a program state lower than or equal to a fourth program state PV4.

In an embodiment, among the memory cells, memory cells having the erase state E and first to third program states PV1 to PV3 as target program states may have threshold voltages corresponding to the erase state E through the intermediate program operation. In an embodiment, among the memory cells, memory cells having fourth to seventh program states PV4 to PV7 as target program states may have threshold voltages corresponding to the middle state MID PV through the intermediate program operation.

The final program state may be the program state of memory cells on which the intermediate program operation and the final program operation have been performed. Each memory cell may have a threshold voltage corresponding to any one of final program states through the final program operation. In an embodiment, when the memory cells are programmed according to a TLC scheme, the target program states may indicate the erase state E and first to seventh program states PV1 to PV7.

In detail, memory cells having threshold voltages corresponding to the erase state E in the intermediate program state may have threshold voltages corresponding to any one of the erase state E and the first to third program states PV1 to PV3 through the final program operation. Memory cells having threshold voltages corresponding to the middle state MID PV in the intermediate program state may have threshold voltages corresponding to any one of the fourth to seventh program states PV4 to PV7 through the final program operation.

Each of the memory cells may have any one of the erase state E and the first to seventh program states PV1 to PV7, which are the final program states, as the target program state. The target program state may be determined depending on the data to be stored in each memory cell. During the intermediate program operation, each memory cell may have a threshold voltage corresponding to any one of the erase state E and the middle state MID PV, and during the final program operation, each memory cell may have a threshold voltage corresponding to any one of the erase state E and the first to seventh program states PV1 to PV7.

Figure 3:
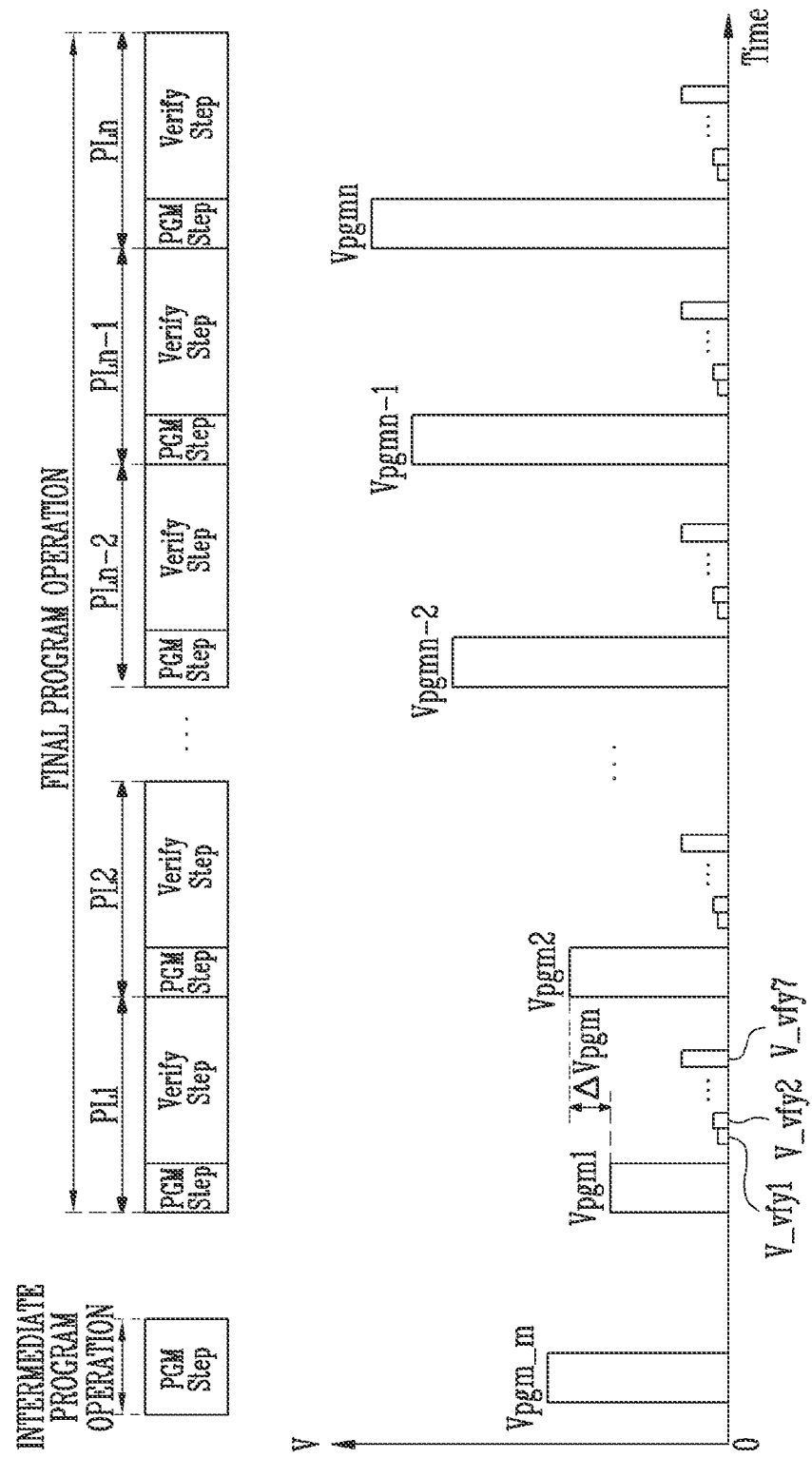
FIG. 3 is a diagram illustrating a program operation of a memory device.

FIG. 3 is a diagram illustrating a program operation of a memory device.

In FIG. 3, the horizontal axis of a graph indicates time and the vertical axis thereof indicates voltage V applied to a word line.

In FIG. 3, a description is made on the assumption that data is programmed according to a TLC scheme in which one memory cell stores three bits of data. However, the scope of the present disclosure is not limited thereto, and one memory cell may be programmed to store two or fewer bits of data or to store four or more bits of data.

Referring to FIG. 3, the program operation may include an intermediate program operation and a final program operation. The intermediate program operation may be an operation of applying a middle program voltage Vpgm_m to a word line coupled to selected memory cells. In an embodiment, the middle program voltage Vpgm_m may be a voltage having a preset magnitude. During the intermediate program operation, a program-enable voltage or a program-inhibit voltage may be applied to bit lines coupled to respective memory cells. In detail, when the middle program voltage Vpgm_m is applied to a word line, the program-inhibit voltage may be applied to the bit line coupled to memory cells having the erase state E or the first to third program states PV1 to PV3 as target program states. Further, when the middle program voltage Vpgm_m is applied to the word line, the program-enable voltage may be applied to the bit line coupled to memory cells having the fourth to seventh program states PV4 to PV7 as target program states.

The memory device 100 may perform the intermediate program operation and thereafter perform the final program operation. The final program operation may include a plurality of program loops PL1 to PLn. The memory device 100 may perform the plurality of program loops PL1 to PLn so that each of selected memory cells coupled to the selected word line has a threshold voltage corresponding to any one of the final program states. Each of the selected memory cells may have any one of the final program states as a target program state. For example, when one memory cell is programmed according to a TLC scheme, the memory device 100 may perform the final program operation including the plurality of program loops so that each of the selected memory cells has a threshold voltage corresponding to any one of the erase state E and the first to seventh program states PV1 to PV7.

Each of the plurality of program loops PL1 to PLn may include a program voltage apply operation (PGM Step) and a verify operation (Verify Step).

The program voltage apply operation (PGM Step) may be an operation of applying a program voltage to the selected word line coupled to the selected memory cells. For example, the memory device 100 may apply a first program voltage Vpgm1 to the selected word line coupled to selected memory cells in the first program loop PL1. After the first program voltage Vpgm1 is applied to the selected word line, respective threshold voltages of the selected memory cells may be the threshold voltages corresponding to target program states, among final program states.

The verify operation (Verify Step) may be an operation of applying a verify voltage to the selected word line coupled to the selected memory cells. The verify operation (Verify step) may be an operation of determining whether respective threshold voltages of the selected memory cells are threshold voltages corresponding to the target program states, among the final program states. The verify operation (Verify Step) may be an operation of applying verify voltages corresponding to respective target program states of the selected memory cells.

In an embodiment, in the first program loop PL1, after a first program voltage Vpgm1 is applied to the selected word line coupled to the selected memory cells, the memory device 100 may apply first to seventh verify voltages V_vfy1 to V_vfy7 to the selected word line. The memory device 100 may apply a verify voltage corresponding to the target program states of the memory cells, among the first to seventh verify voltages V_vfy1 to V_vfy7, to the selected word line. For example, the memory device 100 may perform the verify operation (Verify Step) on the memory cells having the first program state as the target program state using the first verify voltage V_Vfy1. The magnitudes of the verify voltages V_vfy1 to V_vfy7 may increase in the direction from the first verify voltage V_vfy1 to the seventh verify voltage V_vfy7. In detail, for the magnitudes of the verify voltages V_vfy1 to V_vfy7, the first verify voltage V_vfy1 may be the lowest, and the seventh verify voltage V_vfy7 may be the highest. The number of verify voltages is not limited to the present embodiment.

It may be determined that the memory cells having passed the verify operation (Verify Step) using respective verify voltages V_vfy1 to V_vfy7 have threshold voltages corresponding to the target program states. A program-inhibit voltage may be applied to a bit line coupled to memory cells having passed the verify operation (Verify Step) in a second program loop.

It may be determined that the memory cells having failed in the verify operation (Verify Step) using respective verify voltages V_vfy1 to V_vfy7 do not have threshold voltages corresponding to the target program states. The memory cells having failed in the verify operation (Verify Step) may perform the second program loop PL2. A program-enable voltage may be applied to a bit line coupled to memory cells having failed in the verify operation (Verify Step) in the second program loop.

In the second program loop PL2, the memory device 100 may apply a second program voltage Vpgm2, higher than the first program voltage Vpgm1 by a unit voltage $\Delta$Vpgm, to the selected word line coupled to the selected memory cells. Thereafter, the memory device 100 may perform the verify operation (Verify Step) of the second program loop PL2 in the same manner as the verify operation (Verify Step) of the first program loop PL1.

Thereafter, the memory device 100 may perform a subsequent program loop in the same manner as the second program loop PL2 a preset number of times.

In an embodiment, when the program operation is not completed within a preset number of program loops, the program operation may fail. When the program operation is completed within a preset number of program loops, the program operation may pass. Whether the program operation is completed may be determined depending on whether all of the selected memory cells have passed the verify operation (Verify Step). When all of the selected memory cells have passed the verify operation (Verify Step), a subsequent program loop might not be performed.

In an embodiment, the program voltage may be determined based on an incremental step pulse programming (ISPP) scheme. The level of the program voltage may be stepwise increased or decreased as the program loops PL1 to PLn are repeated. The number of times that program voltages used in each program loop are applied, the voltage levels of the program voltages, voltage apply times, etc. may be determined in various forms under the control of the memory controller 200.

Figure 4:
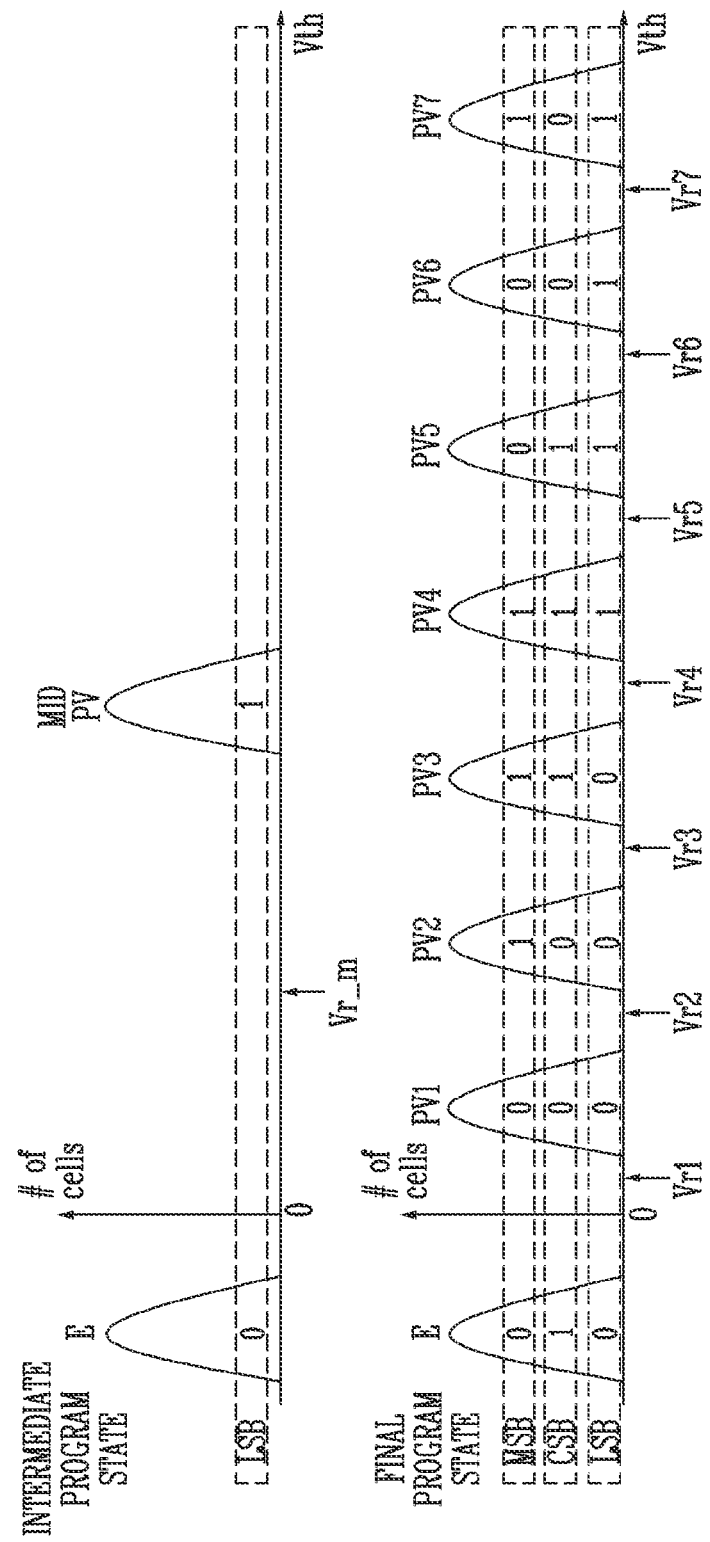
FIG. 4 is a diagram illustrating threshold voltage distributions of memory cells, each storing at least one bit of data.

FIG. 4 is a diagram illustrating threshold voltage distributions of memory cells, each storing at least one bit of data.

In FIG. 4, the horizontal axis of each graph indicates threshold voltages Vth of memory cells, and the vertical axis thereof indicates the number of memory cells (# of cells).

Referring to FIG. 4, the intermediate program state may be the program state of memory cells on which an intermediate program operation has been performed. Each of the memory cells on which the intermediate program operation has been performed may have a threshold voltage corresponding to any one of an erase state E or a middle state MID PV. In the intermediate program state, one memory cell may store one data bit. In an embodiment, after the intermediate program operation is performed, data of "0" may be stored in a memory cell having a threshold voltage corresponding to the erase state. In an embodiment, after the intermediate program operation is performed, data of "1" may be stored in a memory cell having a threshold voltage corresponding to the middle state. During the intermediate program operation, data stored in each memory cell may be least significant bit (LSB) data.

A middle read voltage Vr_m may be a read voltage for distinguishing the erase state E and the middle state of memory cells from each other in the intermediate program state. In an embodiment, the middle read voltage Vr_m may be a voltage for reading LSB data stored in memory cells after the intermediate program operation is performed.

The final program state may be the program state of memory cells on which the final program operation has been performed. Each of the memory cells may have a threshold voltage corresponding to any one of the erase state E and the first to seventh program states PV1 to PV7 during the final program operation. In the final program state, one memory cell may store a plurality of bits of data. In an embodiment, when memory cells are programmed according to a TLC scheme, one memory cell may store three bits of data. The three bits of data may include LSB data, central significant bit (CSB) data, and most significant bit (MSB) data.

During the final program operation, the data stored in each memory cell may be CSB data and LSB data. That is, the memory device 100 may store LSB data in each memory cell during the intermediate program operation, and may store CSB data and MSB data in the corresponding memory cell during the final program operation.

A fourth read voltage Vr4 may be a voltage for identifying LSB data in the final program state. A first read voltage Vr1, a third read voltage Vr3, and a sixth read voltage Vr6 may be a voltage for identifying CSB data. A second read voltage Vr2, a fifth read voltage Vr5, and a seventh read voltage Vr7 may be a voltage for identifying MSB data.

In the final program state, LSB data corresponding to the erase state E and the first to third program states PV1 to PV3 may equally have a value of 0, and LSB data corresponding to the fourth to seventh program states PV4 to PV7 may equally have a value of 1. That is, the LSB data in the intermediate program state is stored in the memory cell, but the erase state E, the first to third program states PV1 to PV3, and the fourth to seventh program states PV4 to PV7 need to be distinguished from each other, and thus all of LSB data, CSB data, and MSB data may be used in the final program operation.

Figure 5:
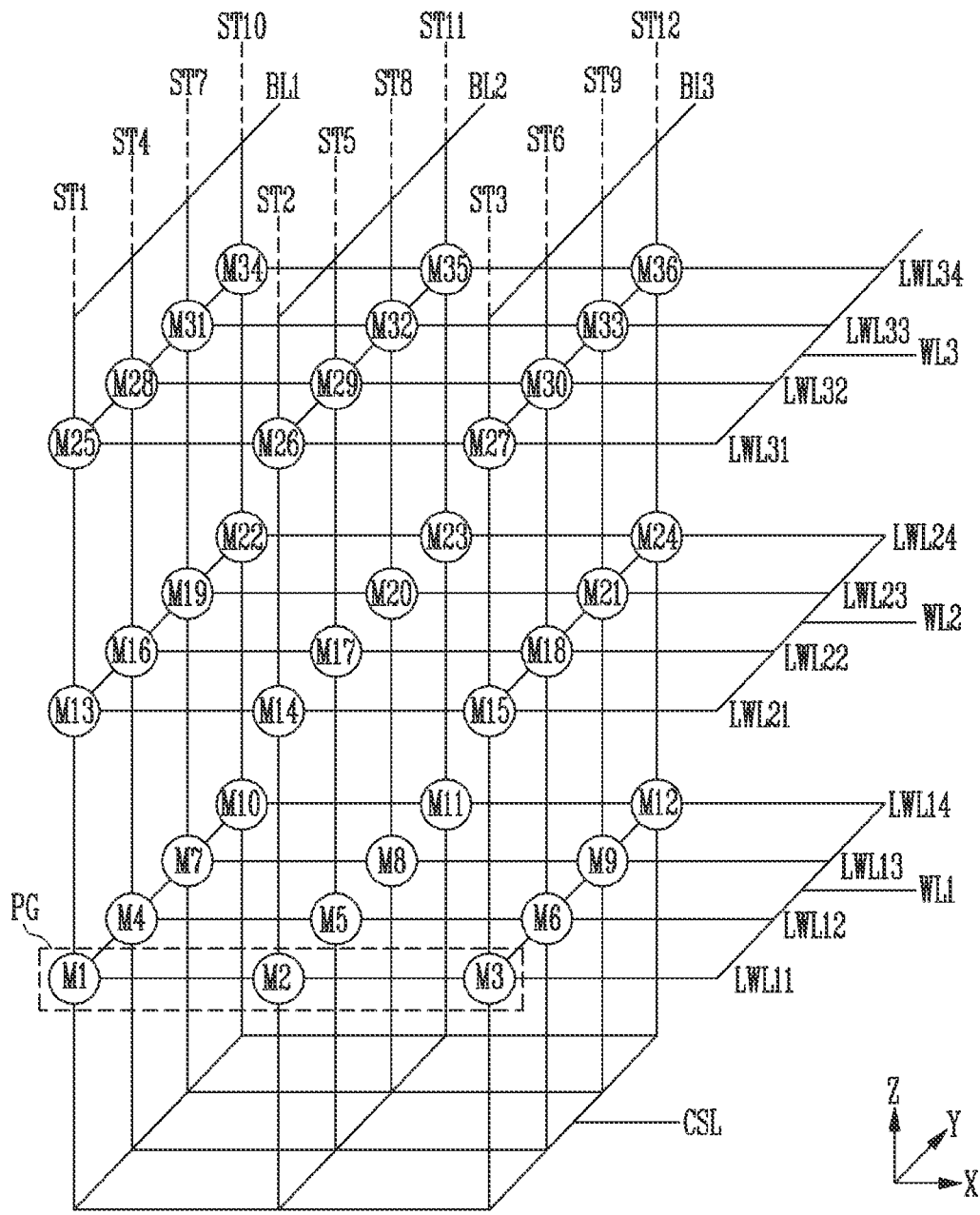
FIG. 5 is a diagram illustrating the structure of a memory block having a three-dimensional (3D) structure.

FIG. 5 is a diagram illustrating the structure of a memory block having a three-dimensional (3D) structure.

Referring to FIG. 5, the memory block may include a plurality of memory cells M1 to M36. The plurality of memory cells M1 to M36 may be coupled between bit lines BL1 to BL3 and a common source line CSL. One word line may be coupled in common to four local word lines. For example, the first word line WL1 may be coupled in common to eleventh to fourteenth local word lines LWL11 to LWL14. Memory cells may be coupled to each of the local word lines. Memory cells coupled to one local word line may form one physical page. For example, first to third memory cells M1 to M3 coupled to the eleventh local word line LWL11 may form a first physical page (PG). One word line may include a number of physical pages identical to the number of local word lines coupled in common thereto.

The number of local word lines coupled to one word line may be determined depending on the number of memory cell strings coupled in common to one bit line. For example, when four memory cell strings are coupled in common to one bit line, four local word lines may be coupled in common to one word line. In this case, one word line may include four physical pages.

One memory cell string may include memory cells coupled in series to each other in a Z direction. For example, a first memory cell string ST1 may include a first memory cell M1, a thirteenth memory cell M13, and a 25-th memory cell M25. Memory cell strings in a Y direction may be coupled to one bit line. For example, the first memory cell string ST1, a fourth memory cell string ST4, a seventh memory cell string ST7, and a tenth memory cell string ST10 may be coupled to the first bit line BL1.

In an embodiment, one physical page may store data of a plurality of logical pages. The number of pieces of logical page data to be stored in one physical page may be determined depending on the number of pieces of bit data stored in one memory cell. For example, when one memory cell stores three bits of data, the plurality of pieces of logical page data may include LSB page data, CSB page data, and MSB page data.

The numbers of word lines, local word lines, memory cell strings, bit lines, and memory cells, illustrated in FIG. 5, may be provided for convenience of description, and may be less than or greater than those illustrated in FIG. 5.

Figure 6:
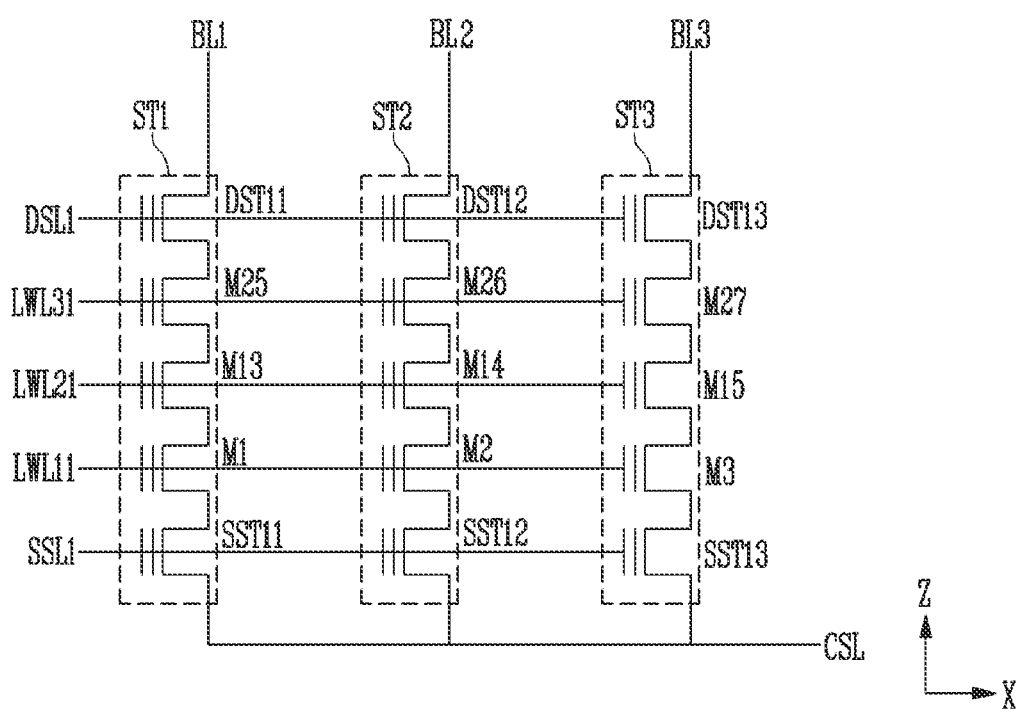
FIG. 6 is a diagram illustrating some memory cell strings illustrated in FIG. 5.

FIG. 6 is a diagram illustrating some of memory cell strings illustrated in FIG. 5.

In FIG. 6, a description will be made with reference to FIG. 5. Referring to FIG. 6, the first to third memory cell strings ST1 to ST3 may be coupled to the first to third bit lines BL1 to BL3, respectively. The first to third memory cell strings ST1, ST2, and ST3 may include drain select transistors DST11, DST12, and DST13, respectively, coupled in common to a first drain select line DSL1. The first to third memory cell strings ST1, ST2, and ST3 may include source select transistors SST11, SST12, and SST13, respectively, coupled in common to a first source select line SSL1. Each memory cell string may include memory cells coupled to different local word lines, respectively. For example, the second memory cell string ST2 may include a second memory cell M2, a fourteenth memory cell M14, and a 26-th memory cell M26 coupled to an eleventh local word line LWL11, a 21-st local word line LWL21, and a 31-st local word line LWL31, respectively.

Figure 7:
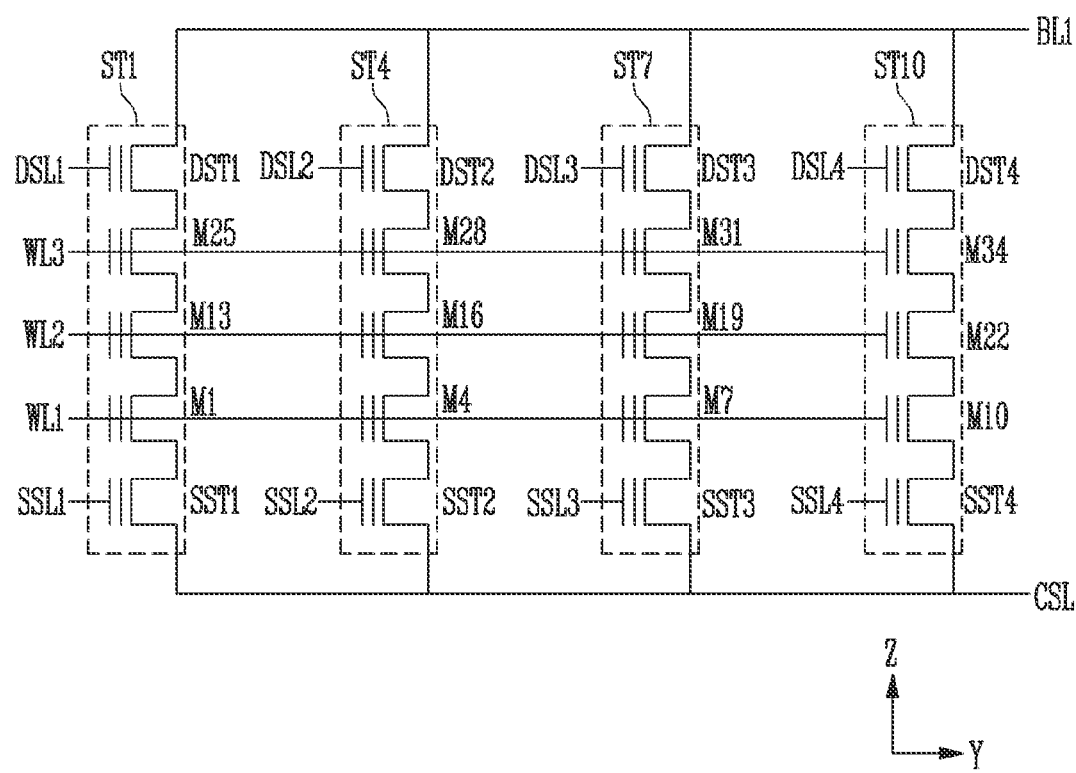
FIG. 7 is a diagram illustrating other memory cell strings illustrated in FIG. 5.

FIG. 7 is a diagram illustrating others of the memory cell strings illustrated in FIG. 5.

In FIG. 7, a description will be made with reference to FIGS. 5 and 6. Referring to FIG. 7, the first memory cell string ST1, the fourth memory cell string ST4, the seventh memory cell string ST7, and the tenth memory cell string ST10 may be coupled between the first bit line BL1 and the common source line CSL. Respective memory cell strings may be coupled to different drain select lines and different source select lines. For example, the first memory cell string ST1 may be coupled to the first drain select line DSL1 and the first source select line SSL1. The first drain select line DSL1 and the first source select line SSL1 may be coupled in common to the first to third memory cell strings ST1 to ST3. The fourth memory cell string ST4 may be coupled to the second drain select line DSL2 and the second source select line SSL2. The second drain select line DSL2 and the second source select line SSL2 may be coupled in common to the fourth to sixth memory cell strings ST4 to ST6. The seventh memory cell string ST7 may be coupled to the third drain select line DSL3 and the third source select line SSL3. The third drain select line DSL3 and the third source select line SSL3 may be coupled in common to the seventh to ninth memory cell strings ST7 to ST9. The tenth memory cell string ST10 may be coupled to the fourth drain select line DSL4 and the fourth source select line SSL4. The fourth drain select line DSL4 and the fourth source select line SSL4 may be coupled in common to the tenth to twelfth memory cell strings ST10 to ST12.

In an example, unlike the case illustrated in FIG. 7, the first to sixth memory cell strings ST1 to ST6 may be coupled in common to one source select line, and the seventh to twelfth memory cell strings ST7 to ST12 may be coupled in common to one source select line.

FIG. 8 is a diagram illustrating an order of a program operation of a memory device.

In FIG. 8, a description will be made with reference to FIGS. 5 and 7. The memory device 100 may perform an intermediate program operation (Inter PGM) and a final program operation (Final PGM) in the order illustrated in FIG. 8. In FIG. 8, memory cells coupled to one local word line Local WL may form one physical page. For example, a second physical page PG2 may include fourth to sixth memory cells M4 to M6 illustrated in FIG. 5, and a twelfth physical page PG12 may include 34-th to 36-th memory cells M34 to M36 illustrated in FIG. 5.

First, the memory device 100 may sequentially perform the intermediate program operation (Inter PGM) on first to fourth physical pages PG1 to PG4 included in the first word line WL1. Thereafter, the memory device 100 may perform the intermediate program operation (Inter PGM) and the final program operation (Final PGM) while the second word line WL2 and the first word line WL1 are alternately selected. In an embodiment, after performing the intermediate program operation (Inter PGM) on a fifth physical page PG5, the memory device 100 may perform the final program operation (Final PGM) on a first physical page PG1. That is, the intermediate program operation (Inter PGM) on each of fifth to eighth physical pages PG5 to PG8 and the final program operation (Final PGM) on each of the first to fourth physical pages PG1 to PG4 may be alternately performed.

In the same manner, the memory device 100 may perform the intermediate program operation (Inter PGM) and the final program operation (Final PGM) while the third word line WL3 and the second word line WL2 are alternately selected. After the intermediate program operation (Inter PGM) on a twelfth physical page PG12 is performed, the final program operation (Final PGM) on an eighth physical page PG8 may be performed. That is, the intermediate program operation (Inter PGM) on each of ninth to twelfth physical pages PG9 to PG12 and the final program operation (Final PGM) on each of fifth to ninth physical pages PG5 to PG9 may be alternately performed.

Thereafter, when the intermediate program operation (Inter PGM) on all physical pages is performed, the final program operation (Final PGM) on the ninth to twelfth physical pages PG9 to PG12 included in the third word line WL3, which is the last word line, may be sequentially performed.

Figure 9:
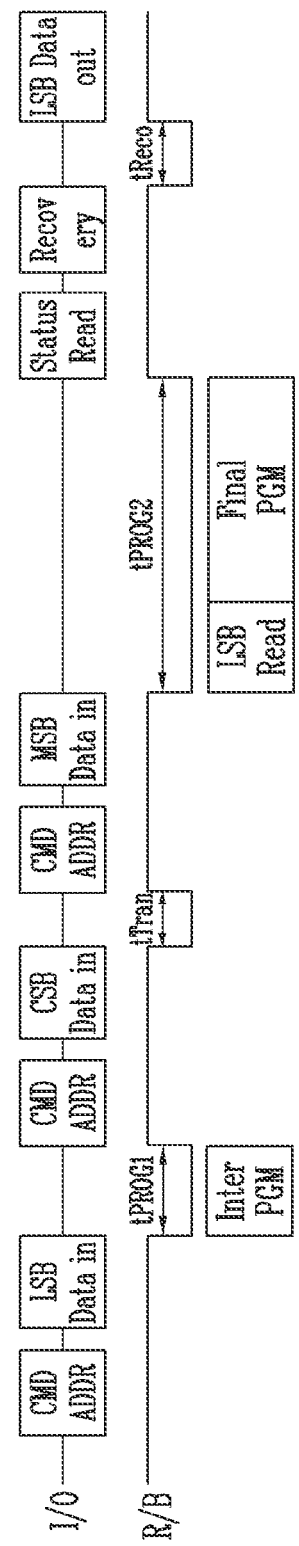
FIG. 9 is a diagram illustrating a program operation and a recovery operation of a memory device.

FIG. 9 is a diagram illustrating a program operation and a recovery operation of a memory device.

Referring to FIGS. 1 and 9, an input/output line I/O and a ready/busy line R/B are illustrated. The memory device 100 may receive a command CMD, an address ADDR, and data from a memory controller 200 through the input/output line I/O. The memory device 100 may output a status signal to the memory controller 200 through the ready/busy line R/B. For example, the memory device 100 may output a busy status signal to the memory controller 200 while an internal operation is being performed. The busy status signal may be at a logic low level. The memory device 100 may output a ready status signal to the memory controller 200 while no operation is being performed. The ready status signal may be at a logic high level.

First, the memory device 100 may receive a command, an address, and LSB data through the input/output line I/O. The memory device 100 may perform an intermediate program operation (Inter PGM) using the LSB data. The time required to perform the intermediate program operation may be a first program time tPROG1. In this case, the memory device may output a busy status signal.

Thereafter, the memory device 100 may receive a command CMD, an address ADDR, and CSB data through the input/output line I/O. Also, a first transfer time tTran may be required to store the CSB data. In detail, the first transfer time tTran may be the time required to move data between latches included in the page buffer of the memory device 100. Next, the memory device 100 may receive a command CMD, an address ADDR, and MSB data through the input/output line I/O. The memory device 100 may read LSB data from memory cells, and may perform a final program operation (Final PGM) using the LSB data, the CSB data, and the MSB data. The time required to perform the final program operation (Final PGM) may be a second program time tPROG2. Here, the memory device 100 may output a busy status signal.

Thereafter, the memory controller 200 may provide a status read command Status Read to the memory device 100 so as to check whether the final program operation has passed. Here, when the final program operation (Final PGM) has failed, the memory device 100 may provide a signal indicating that the final program operation (Final PGM) has failed to the memory controller 200. Thereafter, the memory controller 200 may provide a recovery command Recovery for requesting data required for a reprogram operation to the memory device 100. When data requested by the memory controller 200 is LSB data, the memory device 100 may provide LSB data to the memory controller 200.

Meanwhile, failure of the program operation may mean that threshold voltage distributions of memory cells have not been formed as threshold voltage distributions in which individual program states are distinguished from each other, as in the final program state of FIG. 4. Therefore, to perform a reprogram operation after the program operation has failed, logical page data cannot be read from memory cells, and thus the logical page data may need to be stored in the buffer memory 210 of the memory controller. In detail, referring to FIG. 8, because the memory device 100 alternately performs an intermediate program operation and a final program operation on respective physical pages, the buffer memory 210 may need to store LSB page data of each of second to fourth physical pages PG2 to PG4 on which only the intermediate program operation is performed when the final program operation is being performed on the first physical page PG1. In addition, the buffer memory 210 may also need to store LSB page data of the fifth physical page PG5 to be used for a cache program operation. That is, to prepare for failure of the program operation and perform the cache program operation in the case where the intermediate program operation and the final program operation on respective physical pages are alternately performed, the amount of logical page data to be stored in the buffer memory 210 is large, whereby it may be more profitable to store logical page data in the memory device 100.

Figure 10:
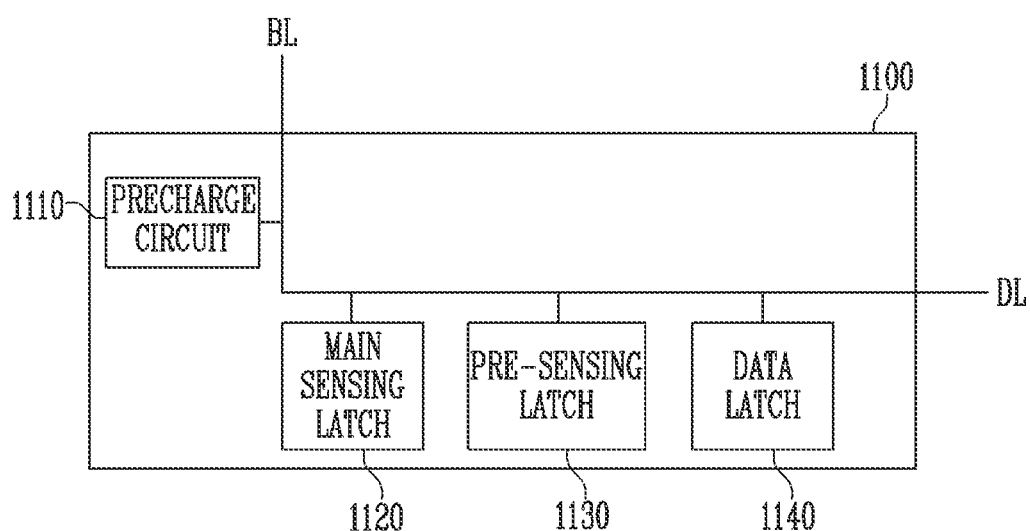
FIG. 10 is a diagram illustrating a page buffer of FIG. 1.

FIG. 10 is a diagram illustrating a page buffer of FIG. 1.

A page buffer 1100 illustrated in FIG. 10 may be any one of first to m-th page buffers PB1 to PBm illustrated in FIG. 1.

Referring to FIG. 10, the page buffer 1100 may include a precharge circuit 1110, a main sensing latch 1120, a pre-sensing latch 1130, and a data latch 1140. The precharge circuit 1110, the main sensing latch 1120, the pre-sensing latch 1130, and the data latch 1140 may be coupled between a bit line BL and a data line DL. The bit line BL may be coupled to a memory cell.

The precharge circuit 1110 may be a circuit for precharging the voltage of the bit line. The precharge circuit 1110 may increase the voltage of the bit line to a program-enable voltage, a program-inhibit voltage, or a precharge voltage depending on the threshold voltage of the memory cell during a program operation.

The main sensing latch 1120 may be a latch for storing data sensed through a main verify operation. The main verify operation may be an operation of identifying the threshold voltages of memory cells using a main verify voltage. The data stored in the main sensing latch 1120 may be data indicating pass or failure (fail) of the main verify operation. In an embodiment, when the threshold voltage of a memory cell is higher than the main verify voltage, the main sensing latch 1120 may store main verify result information indicating that the corresponding memory cell has passed the main verify operation. In an embodiment, when the threshold voltage of a memory cell is lower than the main verify voltage, the main sensing latch 1120 may store main verify result information indicating that the corresponding memory cell has failed in the main verify operation.

The pre-sensing latch 1130 may be a latch for storing data sensed through a pre-verify operation. The pre-verify operation may be an operation of identifying the threshold voltages of memory cells using a pre-verify voltage lower than the main verify voltage. The data stored in the pre-sensing latch 1130 may be data indicating whether the threshold voltages of memory cells are higher than the pre-verify voltage. The main verify operation and the pre-verify operation will be described in detail later with reference to FIG. 11.

The data latch 1140 may be a latch which stores data to be stored in the memory cells. The data latch 1140 may receive the data to be stored in the memory cells from the memory controller through the data line DL. In an embodiment, the data latch 1140 may include a plurality of data latches. In an embodiment, the data latch 1140 may include three data latches, which store LSB data, CSB data, and MSB data, respectively. In an embodiment, the data latch 1140 may include four data latches, which store LSB data, CSB data, MSB data, and LSB data of a next physical page to be programmed, respectively. When the data latch 1140 includes a plurality of data latches, any one of the plurality of data latches may be a cache latch. The cache latch may store data to be output to the memory controller.

Figure 11:
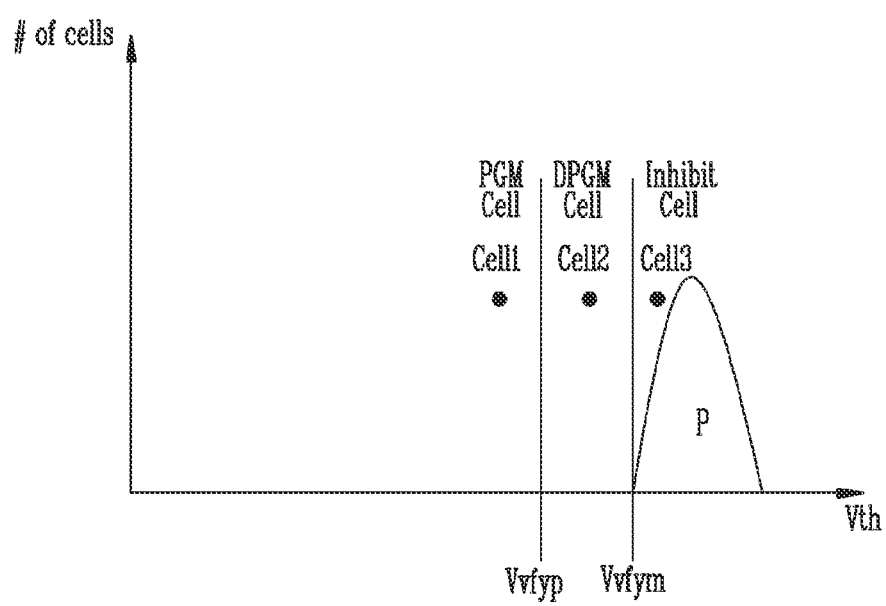
FIG. 11 is a diagram illustrating a main verify operation and a pre-verify operation of a memory device.

FIG. 11 is a diagram illustrating a main verify operation and a pre-verify operation of a memory device.

A program state P illustrated in FIG. 11 may be any one of the first to seventh program states illustrated in FIG. 2. The memory device 100 may perform a main verify operation using a main verify voltage Vvfym and a pre-verify operation using a pre-verify voltage Vvfyp. The main verify voltage Vvfym may be a threshold voltage corresponding to the program state P. The main verify voltage Vvfym may be a threshold voltage corresponding to the target program state of each of the memory cells. The main verify voltage Vvfym may be any one of first to seventh verify voltages V_vfy1 to V_vfy7 illustrated in FIG. 3. The pre-verify voltage Vvfyp may be a voltage lower than the main verify voltage Vvfym.

In an embodiment, the threshold voltages of memory cells on which a program voltage apply operation is terminated in any one of a plurality of program loops may be the threshold voltages of first to third cells Cell1 to Cell3. Thereafter, during a verify operation, the memory device may identify the degrees to which the threshold voltages of memory cells increase using the main verify voltage Vvfym and the pre-verify voltage Vvfyp.

In an embodiment, the first cell Cell1 may have a threshold voltage lower than the pre-verify voltage Vvfyp after the program voltage apply operation in any one program loop is terminated. The second cell Cell2 may have a threshold voltage that is higher than the pre-verify voltage Vvfyp and lower than the main verify voltage Vvfym. The third cell Cell3 may have a threshold voltage higher than the main verify voltage Vvfym.

The threshold voltage of the first cell Cell1 may need to be further increased to the threshold voltage corresponding to the program state P than the threshold voltage of the second cell Cell2. Here, the first cell Cell1 may be a cell to be programmed (PGM Cell). During the program voltage apply operation, a program-enable voltage may be applied to a bit line coupled to the first cell Cell1. In an embodiment, the program-enable voltage may be a ground voltage.

The threshold voltage of the second cell Cell2 may be less increased to the threshold voltage corresponding to the program state P than the threshold voltage of the first cell Cell1. Here, the second cell Cell2 may be a double verify program (DPGM) cell. During the program voltage apply operation, a precharge voltage may be applied to a bit line coupled to the second cell Cell2. In an embodiment, the precharge voltage may be higher than the ground voltage and lower than the program-inhibit voltage.

Because the threshold voltage of the third cell Cell3 is the threshold voltage corresponding to the program state P, the threshold voltage is not to be increased any more. Here, the third cell Cell3 may be an inhibit cell. During the program voltage apply operation, a program-inhibit voltage may be applied to a bit line coupled to the third cell Cell3. In an embodiment, the program-inhibit voltage may be a supply voltage.

In an embodiment, the pre-sensing latch 1130 of FIG. 10 may store data indicating whether each memory cell coupled to the bit line is a cell to be programmed PGM Cell or a DPGM cell in the pre-verify operation using the pre-verify voltage Vvfyp. In an embodiment, the main sensing latch 1120 of FIG. 10 may store data indicating whether each memory cell coupled to the bit line is a cell to be programmed PGM Cell, a DPGM cell, or an inhibit cell in the main verify operation using the main verify voltage Vvfym.

Figure 12:
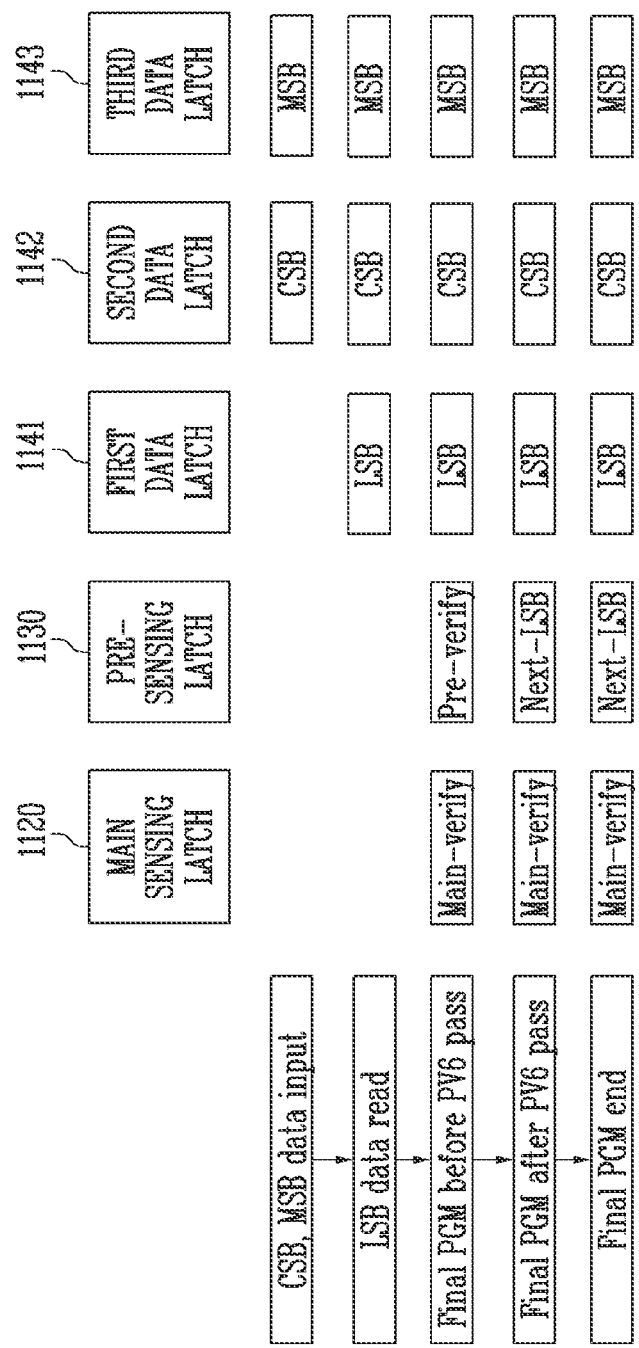
FIG. 12 is a diagram illustrating operation of a page buffer according to an embodiment of the present disclosure.

FIG. 12 is a diagram illustrating the operation of a page buffer according to an embodiment of the present disclosure.

In FIG. 12, the operation of the page buffer corresponding to the case where a data latch includes three data latches will be described below. That is, the data latch 1140 illustrated in FIG. 10 may include a first data latch 1141, a second data latch 1142, and a third data latch 1143. In an embodiment, any one of the first data latch 1141, the second data latch 1142, and the third data latch 1143 may be a cache latch.

In FIG. 12, the case where a final program operation on a second physical page is performed will be described by way of example with reference to FIGS. 5, 8, and 10. The final program operation on the second physical page may be performed after an intermediate program operation on a sixth physical page is terminated. Also, when the final program operation on the second physical page is terminated, an intermediate program operation on a seventh physical page may be performed. In this case, to perform a cache program operation, LSB page data of the seventh physical page may need to be received before the final program operation on the second physical page is terminated.

First, the page buffer 1100 of FIG. 10 may receive CSB data and MSB data to be stored in the second physical page from the memory controller. In detail, the second data latch 1142 may store the CSB data, and the third data latch 1143 may store the MSB data. Thereafter, the page buffer 1100 may store LSB data read from the corresponding memory cell. In detail, the first data latch 1141 may store the LSB data. Thereafter, the final program operation may be performed using the LSB data, the CSB data, and the MSB data stored in the first to third data latches 1141 to 1143, respectively.

Meanwhile, the pre-verify operation may be performed only until a main verify operation for a sixth program state passes. Because the seventh program state is a program state having the highest threshold voltage, among final program states, there is no need to form a threshold voltage distribution narrower than those of first to sixth program states. That is, because the pre-verify operation for the seventh program state might not be performed, data to be stored in the pre-sensing latch 1130 might not be present when the main verify operation for the sixth program state has passed. Accordingly, the pre-sensing latch 1130 may store LSB data Next-LSB of a next physical page when the main verify operation for the sixth program state has passed. For example, referring to FIGS. 5 and 8, the LSB data, the CSB data, and the MSB data stored in the first to third data latches are used for the final program operation on the second physical page, and thus LSB data Next-LSB of the next physical page may be data to be used for the intermediate program operation on the seventh physical page.

After the final program operation on the second physical page is terminated, the LSB data, the CSB data, and the MSB data of the second physical page, and the LSB data of the seventh physical page may be stored in the page buffer 1100. That is, because the memory controller may obtain LSB data, CSB data, and MSB data from the memory device even if the program operation has failed, the buffer memory of the memory controller does not need to store data to prepare for failure of the program operation. That is, the buffer memory of the memory controller may remove the LSB data, the CSB data, and the MSB data therefrom after providing the LSB data, the CSB data, and the MSB data to the memory device. Furthermore, because the page buffer 1100 also stores the LSB data Next-LSB of the next physical page, it may perform a cache program operation while preparing for failure of the program operation.

Figure 13:
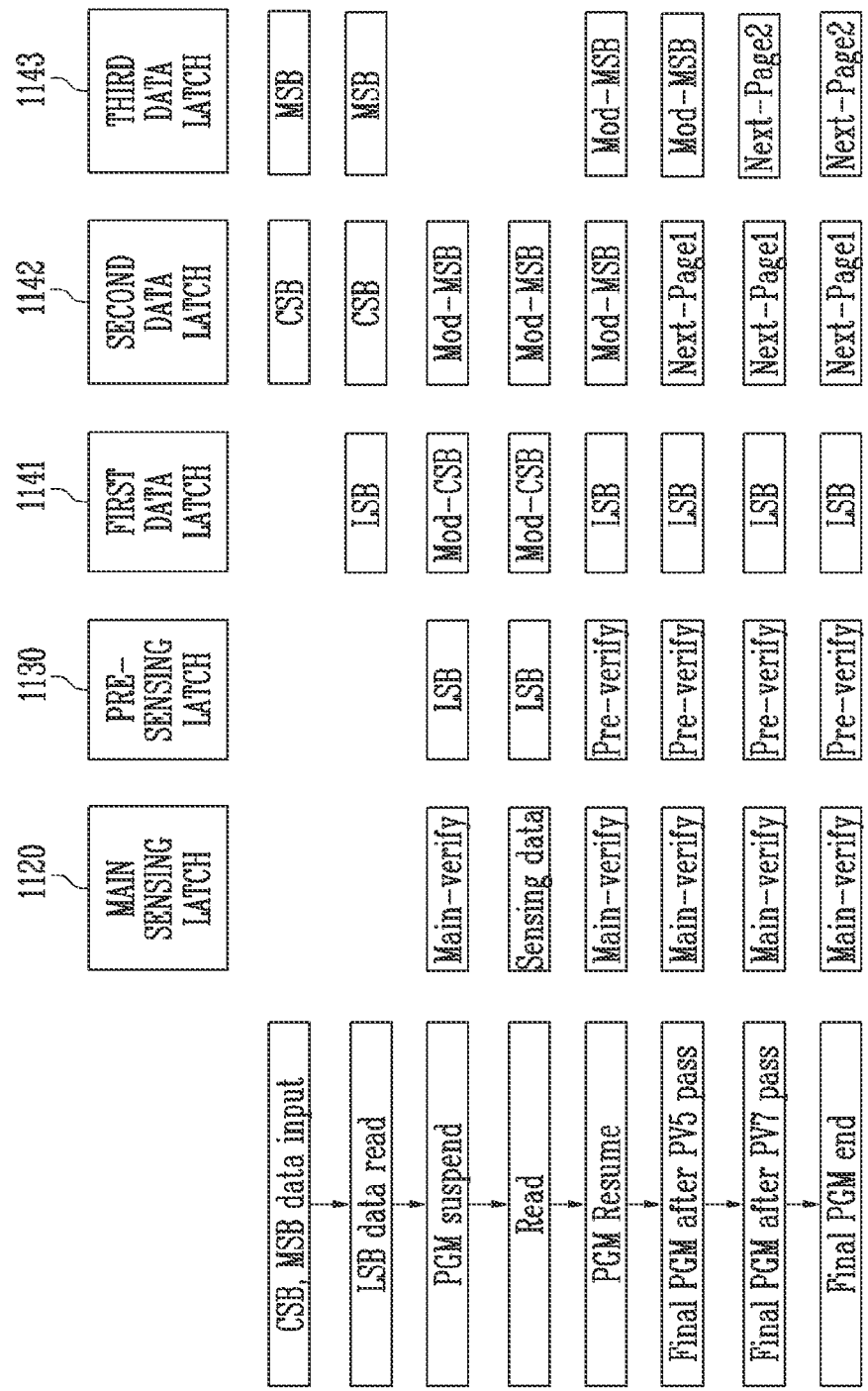
FIG. 13 is a diagram illustrating operation of a page buffer according to an embodiment of the present disclosure.

FIG. 13 is a diagram illustrating the operation of a page buffer according to an embodiment of the present disclosure.

In FIG. 13, the operation of the page buffer corresponding to the case where a data latch includes three data latches will be described below. That is, the data latch 1140 illustrated in FIG. 10 may include a first data latch 1141, a second data latch 1142, and a third data latch 1143. In an embodiment, the third data latch 1143 may be a cache latch.

In FIG. 13, the case where a final program operation on a second physical page is performed will be described by way of example with reference to FIGS. 5, 8, and 10. First, the page buffer 1100 of FIG. 10 may receive CSB data and MSB data to be stored in the second physical page from the memory controller. The CSB data and the MSB data may be stored in the second and third data latches 1142 and 1143. Thereafter, the page buffer 1100 may store LSB data read from the corresponding memory cell. The LSB data may be stored in the first data latch 1141. Thereafter, the final program operation may be performed on the second physical page using the LSB data, the CSB data, and the MSB data.

Thereafter, when a program suspend command is received from the memory controller, the final program operation may be suspended. When the final program operation is suspended, the LSB data stored in the first data latch may be transferred to the pre-sensing latch 1130. Also, main verify data Main-verify indicating the result of the main verify operation on the memory cell coupled to the page buffer 1100 may be stored in the main sensing latch 1120. Since the main verify data Main-verify is data that is used when the final program operation is subsequently resumed, it may be data to be stored in the page buffer 1100. Accordingly, the main verify data Main-verify may be reflected in the CSB data and the MSB data stored in the first and second data latches 1141 and 1142. In the first and second data latches 1141 and 1142, modified CSB data Mod-CSB and modified MSB data Mod-MSB, which are generated by reflecting the main verify data Main-verify in the CSB data and the MSB data, may be stored.

When a read command is received from the memory controller after the final program operation is suspended, the main sensing latch 1120 may store sensing data obtained by sensing the data stored in the memory cell. Thereafter, the sensing data may be output to the memory controller through the third data latch 1143.

When a program resume command is received after the sensing data is output to the memory controller, the modified MSB data Mod-MSB may be transferred to the third data latch 1143, the modified CSB data Mod-CSB may be transferred to the second data latch 1142, and the LSB data may be transferred to the first data latch 1141. Thereafter, the final program operation may be resumed using the LSB data, the modified CSB data Mod-CSB, and the modified MSB data Mod-MSB. Because the LSB data is stored in the first data latch 1141 without being modified, unlike the CSB data and the MSB data, an additional data latch might not be required to store the LSB data in the page buffer other than the buffer memory of the memory controller.

After the final program operation is resumed, the page buffer 1100 may store logical page data to be stored in a next physical page whenever a main verify operation for threshold program states passes. In an embodiment, when the main verify operation for the fifth program state, among the final program states, has passed, first logical page data Next-Page1 to be stored in the next physical page may be stored in the second data latch 1142. Referring to FIG. 4, sixth and seventh program states may be distinguished from each other using only MSB data, whereby the first logical page data Next-Page1 to be stored in the next physical page may be stored in the second data latch 1142. The final program operation for the sixth and seventh program states may be performed using only MSB data.

In an embodiment, when the main verify operation for the seventh program state, among the final program states, has passed, second logical page data Next-Page2 to be stored in the next physical page may be stored in the third data latch 1143.

When the final program operation is terminated, the page buffer 1100 may store the LSB data and the first logical page data Next-Page1 and the second logical page data Next-Page2 of the next physical page. Accordingly, even if the final program operation has failed, the page buffer 1100 may provide the LSB data to the memory controller, and thus the buffer memory of the memory controller does not need to store the LSB data.

Figure 14:
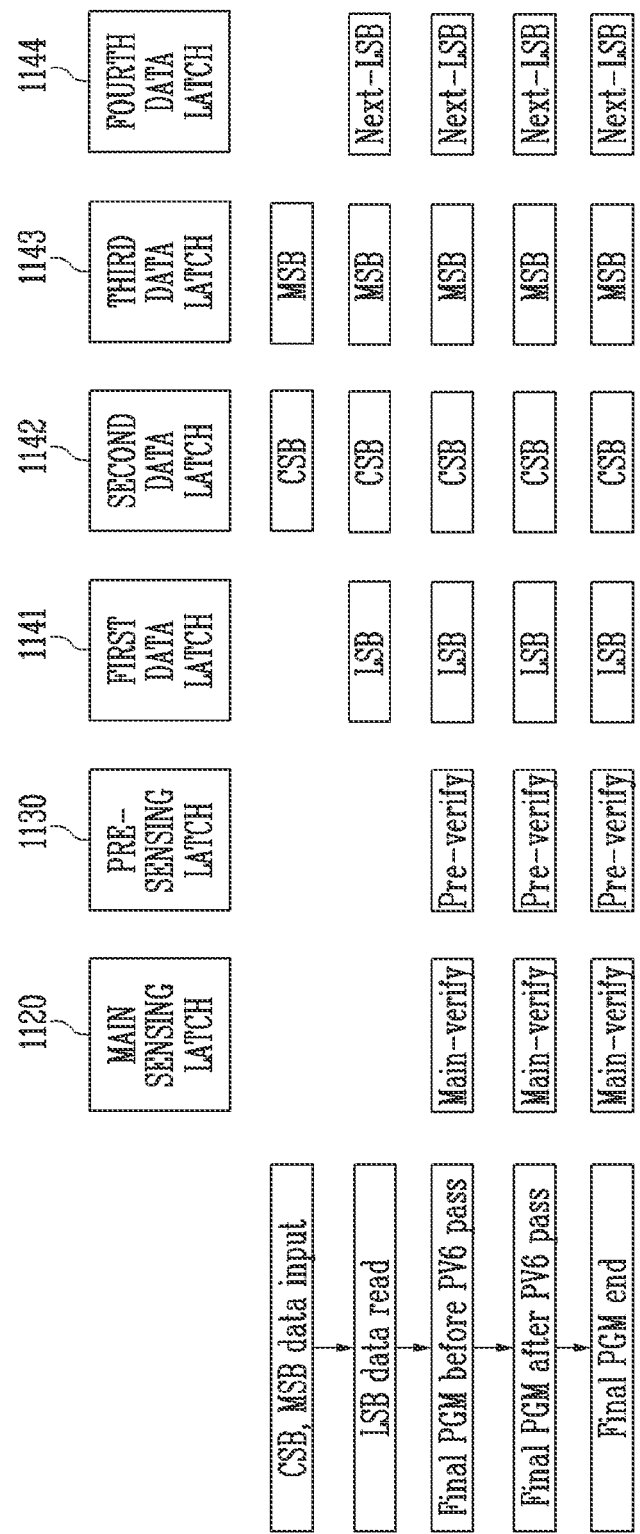
FIG. 14 is a diagram illustrating operation of a page buffer according to an embodiment of the present disclosure.

FIG. 14 is a diagram illustrating the operation of a page buffer according to an embodiment of the present disclosure.

In FIG. 14, the operation of the page buffer corresponding to the case where a data latch includes four data latches will be described below. That is, the data latch 1140 illustrated in FIG. 10 may include a first data latch 1141, a second data latch 1142, a third data latch 1143, and a fourth data latch 1144. In an embodiment, the fourth data latch 1144 may be a cache latch.

In FIG. 14, in the same manner as that in FIG. 12, the case where a final program operation on a second physical page is performed will be described by way of example with reference to FIGS. 5, 8, and 10. First, the page buffer 1100 of FIG. 11 may receive CSB data and MSB data to be stored in the second physical page from the memory controller. In detail, the second data latch 1142 may store the CSB data, and the third data latch 1143 may store the MSB data. Thereafter, the page buffer 1100 may store LSB data read from the corresponding memory cell. In detail, the first data latch 1141 may store the LSB data. Further, the page buffer 1100 may receive LSB data Next-LSB of a next physical page from the memory controller. In detail, the fourth data latch 1144 may store the LSB data Next-LSB of the next physical page. Thereafter, the final program operation may be performed using the LSB data, the CSB data, and the MSB data stored in the first to third data latches 1141 to 1143, respectively.

In an embodiment, when the program operation has failed, the page buffer 1100 may provide any one of the LSB data, CSB data, MSB data, and LSB data Next-LSB of the next physical page to the memory controller. For example, when a recovery command for requesting LSB data is received from the memory controller, the LSB data Next-LSB of the next physical page, stored in the fourth data latch 1144, may be stored in a pre-sensing latch 1130. Thereafter, the LSB data stored in the first data latch 1141 may be provided to the memory controller through the fourth data latch 1144.

After the final program operation on the second physical page is terminated, the LSB data, the CSB data, the MSB data, and the LSB data Next-LSB of the next physical page may be stored in the page buffer 1100. That is, the data latch is composed of the four latches, thus enabling a cache program operation to be performed and making it possible to prepare for failure of the program operation. Furthermore, because LSB data, CSB data, and MSB data are stored in the page buffer 1100, the buffer memory of the memory controller does not need to store LSB data, CSB data, and MSB data to prepare for failure of a program operation.

Figure 15:
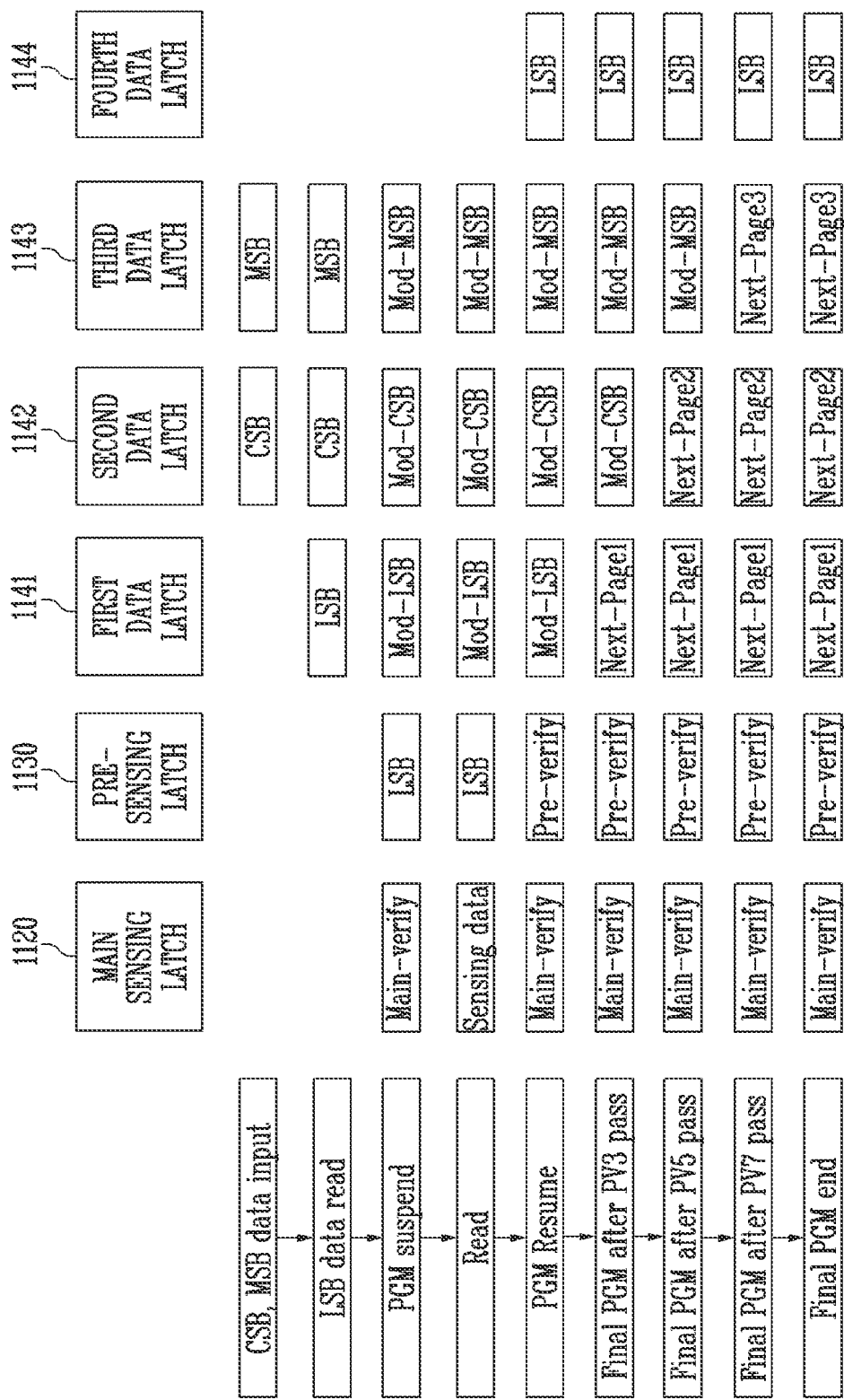
FIG. 15 is a diagram illustrating operation of a page buffer according to an embodiment of the present disclosure.

FIG. 15 is a diagram illustrating the operation of a page buffer according to an embodiment of the present disclosure.

In FIG. 15, the operation of the page buffer corresponding to the case where a data latch includes four data latches will be described below. That is, the data latch 1140 illustrated in FIG. 10 may include a first data latch 1141, a second data latch 1142, a third data latch 1143, and a fourth data latch 1144. In an embodiment, the fourth data latch 1144 may be a cache latch.

In FIG. 15, in the same manner as that in FIG. 12, the case where a final program operation on a second physical page is performed will be described by way of example with reference to FIGS. 5, 8, and 10. First, the page buffer 1100 of FIG. 10 may receive CSB data and MSB data to be stored in the second physical page from the memory controller. Thereafter, the page buffer 1100 may store LSB data read from the corresponding memory cell. In detail, the first to third data latches 1141 to 1143 may store the LSB data, the CSB data, and the MSB data, respectively. Thereafter, the final program operation may be performed on the second physical page using the LSB data, the CSB data, and the MSB data.

Thereafter, when a program suspend command is received, the final program operation may be suspended. When the final program operation is suspended, the LSB data stored in the first data latch 1141 may be transferred to a pre-sensing latch 1130. In an embodiment, when the memory cell coupled to the page buffer 1100 has passed a main verify operation, the main sensing latch 1120 may store main verify data Main-verify indicating that the memory cell is in a program-inhibit state. Also, because the threshold voltage of the memory cell coupled to the page buffer 1100 is not to be increased even after the final program operation is resumed, the main verify data Main-verify may be data to be stored. Furthermore, when the memory cell has passed the main verify operation, the LSB data, the CSB data, and the MSB data stored in the first to third data latches 1141 to 1143 may no longer be required. Accordingly, the main verify data Main-verify may be reflected in the LSB data, the CSB data, and the MSB data stored in the first to third data latches 1141 to 1143. In the first to third data latches 1141 to 1143, modified LSB data Mod-LSB, modified CSB data Mod-CSB, and modified MSB data Mod-MSB, which are generated by reflecting the main verify data Main-verify in the LSB data, the CSB data, and the MSB data, may be stored. In an embodiment, when the memory cell coupled to the page buffer 1100 has failed in the main verify operation, the original data, that is, the LSB data, the CSB data, and the MSB data, may be stored in the first to third data latches 1141 to 1143.

When a read command is received after the final program operation is suspended, the main sensing latch 1120 may store sensing data obtained by sensing the data stored in the memory cell. Thereafter, the sensing data may be output to the memory controller through the fourth data latch 1144.

After the sensing data is output to the memory controller, a program resume command may be received. When the program resume command is received, the LSB data stored in the pre-sensing latch 1130 may be stored in the fourth data latch 1144. Thereafter, the final program operation may resume.

In an embodiment, after the final program operation is resumed, the page buffer 1100 may store logical page data to be stored in a next physical page whenever a main verify operation for threshold program states passes. In an embodiment, when the main verify operation for the third program state, among the final program states, has passed, first logical page data Next-Page1 to be stored in the next physical page may be stored in the first data latch 1141. In an embodiment, the first logical page data Next-Page1 may be LSB data. Referring to FIG. 4, pieces of LSB data corresponding to the fourth to seventh program states equally have a value of 1, whereby the final program operation for the fourth to seventh program states may be performed using only the CSB data and the MSB data.

In an embodiment, when the main verify operation for the fifth program state, among the final program states, has passed, second logical page data Next-Page2 to be stored in the next physical page may be stored in the first data latch 1141. In an embodiment, the second logical page data Next-Page2 may be CSB data. Referring to FIG. 4, pieces of CSB data corresponding to the sixth and seventh program states equally have a value of 0, whereby the final program operation for the sixth and seventh program states may be performed using only the MSB data.

In an embodiment, when the main verify operation for the seventh program state, among the final program states, has passed, third logical page data Next-Page3 to be stored in the next physical page may be stored in the first data latch 1141. In an embodiment, the third logical page data Next-Page3 may be MSB data.

When the final program operation is terminated, the page buffer 1100 may store the LSB data, and the first logical page data Next-Page1, the second logical page data Next-Page2, and the third logical page data Next-Page3 of the next physical page. Accordingly, even if the final program operation has failed, the LSB data is stored in the page buffer 1100, and thus the buffer memory of the memory controller does not need to store the LSB data.

Figure 16:
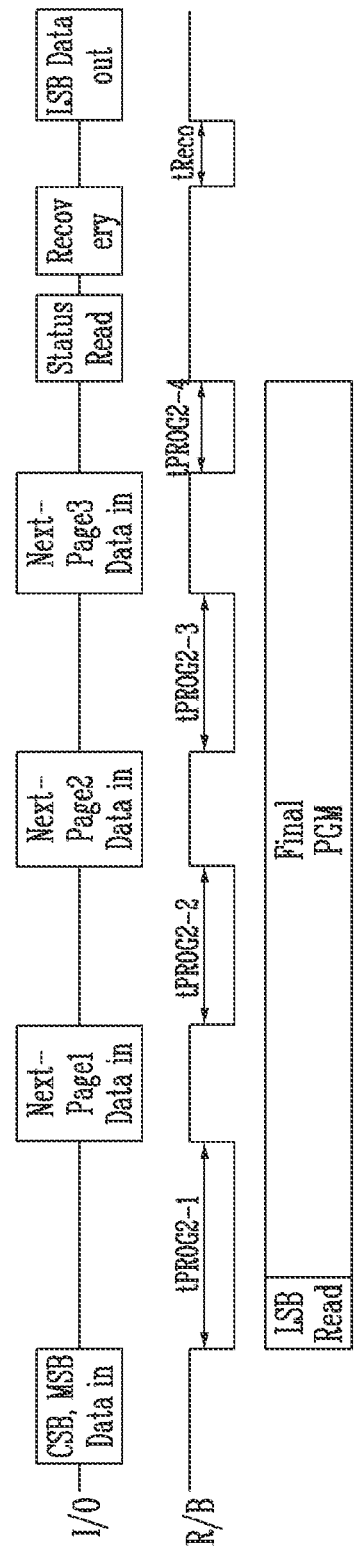
FIG. 16 is a diagram illustrating a cache program operation and a recovery operation of a memory device.

FIG. 16 is a diagram illustrating a cache program operation and a recovery operation of a memory device.

Repeated descriptions of configuration identical to that of FIG. 9 will be omitted in FIG. 16. In FIG. 16, illustration of a command and an address received from a memory controller is omitted for convenience of description.

Referring to FIGS. 1 and 16, the memory device 100 may receive CSB data and MSB data from the memory controller. Further, the memory device 100 may read LSB data from memory cells and thereafter perform a final program operation (Final PGM) using the LSB data, the CSB data, and the MSB data. When a main verify operation for a third program state has passed, the memory device 100 may receive first logical page data of a next physical page. The time during which the final program operation is performed until the main verify operation for the third program state passes may be a 2-1-th program time tPROG2-1. When a main verify operation for a fifth program state has passed, the memory device 100 may receive second logical page data of the next physical page. The time during which the final program operation is performed until the main verify operation for the fifth program state passes may be a 2-2-th program time tPROG2-2. When a main verify operation for a seventh program state has passed, the memory device 100 may receive third logical page data of the next physical page. The time during which the final program operation is performed until the main verify operation for the seventh program state passes may be a 2-3-th program time tPROG2-3. A 2-4-th program time tPROG2-4 may be the time during which MSB data of the next physical page is stored in the third data latch.

Thereafter, the memory controller may provide a status read command Status Read to the memory device 100 so as to check whether the final program operation has passed. Here, when the final program operation (Final PGM) has failed, the memory device 100 may provide a signal indicating that the final program operation (Final PGM) has failed to the memory controller 200. Thereafter, the memory controller 200 may provide a recovery command Recovery for requesting LSB data required for a reprogram operation to the memory device 100. The memory device 100 may provide the LSB data to the memory controller 200 in response to the recovery command.

Figure 17:
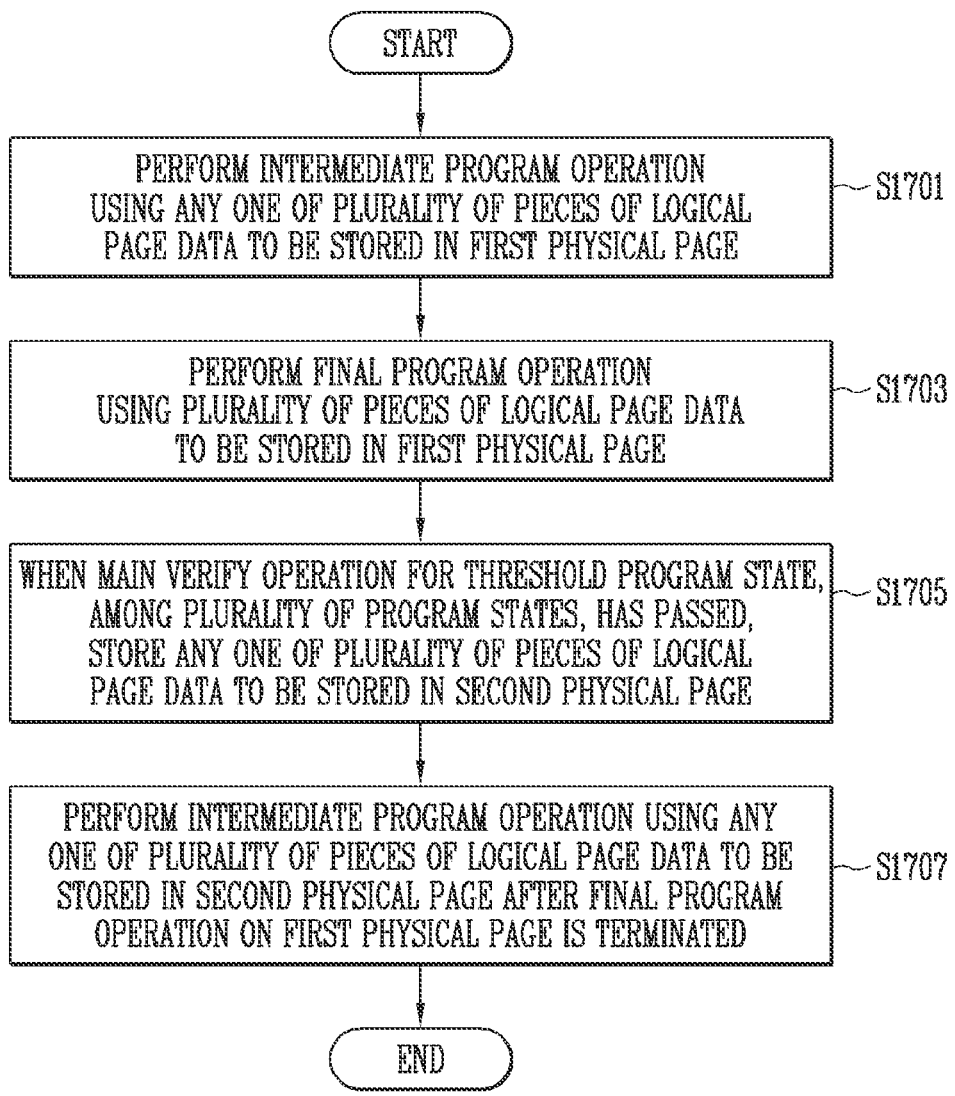
FIG. 17 is a flowchart illustrating an intermediate program operation and a final program operation of a memory device.

FIG. 17 is a flowchart illustrating an intermediate program operation and a final program operation of a memory device.

Referring to FIG. 17, at step S1701, the memory device 100 may perform an intermediate program operation using any one of a plurality of pieces of logical page data to be stored in a first physical page. The one piece of logical page data may be LSB page data.

At step S1703, the memory device 100 may perform a final program operation using the plurality of pieces of logical page data to be stored in the first physical page.

At step S1705, when a main verify operation for a threshold program state, among a plurality of program states, has passed, the memory device 100 may store any one of a plurality of pieces of logical page data to be stored in a second physical page. The threshold program state may be a sixth program state. Here, the memory device 100 may store LSB, CSB, and MSB page data to be stored in the first physical page, and LSB page data to be stored in the second physical page. Because the memory device 100 stores the LSB, CSB, and MSB page data to be stored in the first physical page, the memory device 100 may prepare for failure of the final program operation. Because the memory device 100 stores the LSB page data to be stored in the second physical page, the memory device 100 may perform a cache program operation.

At step S1707, the memory device 100 may perform an intermediate program operation using any one of the plurality of pieces of logical page data to be stored in the second physical page after the final program operation on the first physical page is terminated. The one piece of logical page data may be LSB page data.

Figure 18:
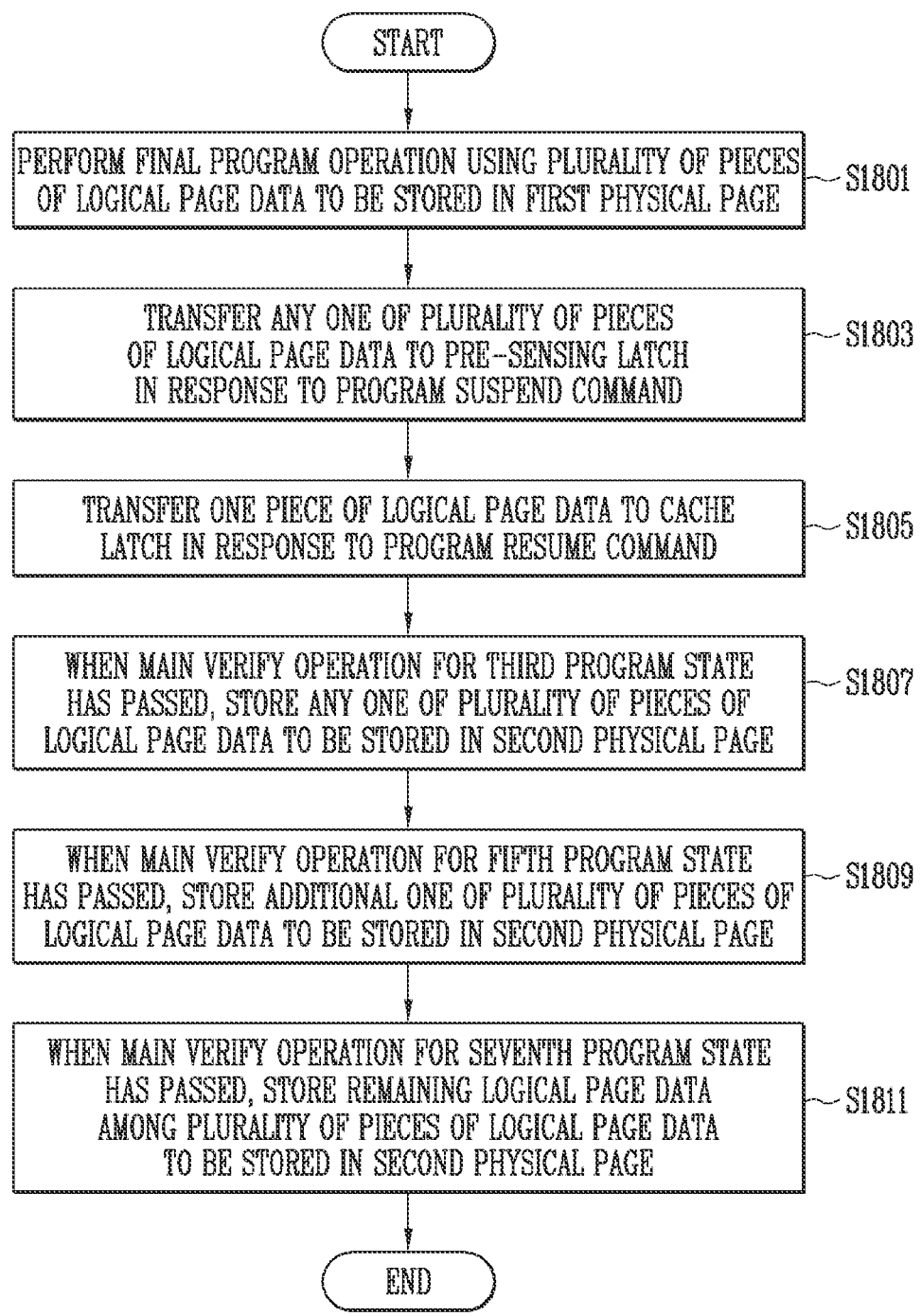
FIG. 18 is a flowchart illustrating a program suspend operation, a resume operation, and a cache program operation of a memory device.

FIG. 18 is a flowchart illustrating a program suspend operation, a resume operation, and a cache program operation of a memory device.

Referring to FIG. 18, at step S1801, the memory device 100 may perform a final program operation using the plurality of pieces of logical page data to be stored in a first physical page.

At step S1803, the memory device 100 may transfer any one of a plurality of pieces of logical page data to a pre-sensing latch in response to a program suspend command. The one piece of logical page data may be LSB page data to be stored in the first physical page.

At step S1805, the memory device 100 may transfer the one piece of logical page data to a cache latch in response to a program resume command.

At step S1807, when a main verify operation for a third program state has passed, the memory device 100 may store any one of a plurality of pieces of logical page data to be stored in a second physical page. The one piece of logical page data may be LSB page data to be stored in the second physical page.

At step S1809, when a main verify operation for a fifth program state has passed, the memory device 100 may store an additional one of a plurality of pieces of logical page data to be stored in the second physical page. The additional one piece of logical page data may be CSB page data to be stored in the second physical page.

At step S1811, when a main verify operation for a seventh program state has passed, the memory device 100 may store the remaining logical page data, among the plurality of pieces of logical page data to be stored in the second physical page. The remaining logical page data may be MSB page data to be stored in the second physical page.

FIG. 19 is a flowchart illustrating an embodiment of a program suspend operation, a resume operation, and a cache program operation of a memory device.

Referring to FIG. 19, at step S1901, the memory device 100 may perform a final program operation using the plurality of pieces of logical page data to be stored in a first physical page.

At step S1903, the memory device 100 may transfer any one of a plurality of pieces of logical page data to a pre-sensing latch in response to a program suspend command. For example, the memory device 100 may transfer LSB data stored in a first data latch to the pre-sensing latch.

At step S1905, the memory device 100 may transfer the one piece of logical page data to any one of a plurality of data latches in response to a program resume command. For example, the memory device 100 may transfer the LSB data stored in the pre-sensing latch to the first data latch.

At step S1907, when a main verify operation for a fifth program state has passed, the memory device 100 may store first logical page data to be stored in a second physical page. The second physical page may be a physical page on which an intermediate program operation is to be performed after the final program operation on the first physical page is performed.

At step S1909, when a main verify operation for a seventh program state has passed, the memory device 100 may store second logical page data to be stored in the second physical page.

At step S1911, the memory device 100 may transfer the one piece of logical page data to the memory controller in response to a recovery command. The recovery command may be a command received from the memory controller when a final program operation on the first physical page has failed.

In accordance with the present disclosure is a memory device capable of recovering data required for a reprogram operation when a program operation has failed and a memory system including the memory device.

What is claimed is:

1. A memory device, comprising:
   first memory cells, each configured to be programmed to have a threshold voltage corresponding to any one of a plurality of program states;
   data latches configured to respectively store a plurality of pieces of first logical page data to be stored in the first memory cells; and
   a pre-sensing latch configured to store data sensed through a pre-verify operation,
   wherein the pre-sensing latch stores second logical page data to be stored in second memory cells when a main verify operation for a threshold program state, among the plurality of program states, has passed.

2. The memory device according to claim 1, further comprising:
   a main sensing latch configured to store data sensed through the main verify operation.

3. The memory device according to claim 2, wherein the main verify operation is an operation of identifying threshold voltages of the first memory cells using a main verify voltage corresponding to the one program state.

4. The memory device according to claim 1, wherein the pre-verify operation is an operation of identifying threshold voltages of the first memory cells using a pre-verify voltage lower than a main verify voltage used for the main verify operation.

5. The memory device according to claim 1, further comprising:
   a control logic circuit configured to perform an intermediate program operation on the first memory cells using any one of the plurality of pieces of first logical page data, and thereafter perform a final program operation on the first memory cells using the plurality of pieces of first logical page data.

6. The memory device according to claim 5, wherein the control logic circuit is configured to perform the final program operation on the first memory cells and thereafter perform the intermediate program operation on the second memory cells using the second logical page data.

7. The memory device according to claim 5, wherein the intermediate program operation is an operation of allowing each of the first memory cells to have a threshold voltage corresponding to any one of an erase state or a middle state.

8. The memory device according to claim 1, wherein any one of the data latches is configured to provide any one of the plurality of pieces of first logical page data to an external memory controller in response to a failure of a final program operation of storing remaining logical page data, among the plurality of pieces of first logical page data, in the first memory cells.

9. The memory device according to claim 1, wherein the data latches are configured to obtain any one of the plurality of pieces of first logical page data from the first memory cells and obtain remaining logical page data, among the plurality of pieces of first logical page data, from an external memory controller.

10. A memory device, comprising:
    a memory block including a first physical page and a second physical page;
    data latches configured to respectively store a plurality of pieces of first logical page data to be stored in the first physical page; and
    a cache latch configured to store second logical page data to be stored in the second physical page,
    wherein any one of the data latches is configured to, when a program operation of storing the plurality of pieces of first logical page data in the first physical page has failed, provide any one of the plurality of pieces of first logical page data to an external memory controller.

11. The memory device according to claim 10, wherein the program operation includes an intermediate program operation of storing the one piece of first logical page data in the first physical page and a final program operation of storing remaining logical page data, among the plurality of pieces of first logical page data, in the first physical page.

12. The memory device according to claim 11, wherein the intermediate program operation is an operation of allowing each of memory cells included in the first physical page to have a threshold voltage corresponding to any one of an erase state or a middle state.

13. The memory device according to claim 11, wherein the final program operation is an operation of increasing a threshold voltage of each of memory cells included in the first physical page to a threshold voltage corresponding to a target program state.

14. The memory device according to claim 10, further comprising:
    a pre-sensing latch configured to store data sensed through a pre-verify operation,
    wherein the cache latch is configured to, when the program operation has failed, transfer the second logical page data to the pre-sensing latch.

15. The memory device according to claim 11, wherein the second logical page data is data used for the intermediate program operation on the second physical page after the plurality of pieces of first logical page data are stored in the first physical page.

16. A memory system, comprising:
    a memory device including a first physical page and a second physical page; and
    a memory controller configured to provide a plurality of pieces of first logical page data to be stored in the first physical page and second logical page data to be stored in the second physical page, and thereafter obtain any one of the plurality of pieces of first logical page data from the memory device in response to a failure of a program operation.

17. The memory system according to claim 16, wherein the memory controller comprises:
    a buffer memory configured to temporarily store data to be provided to the memory device,
    wherein the plurality of pieces of first logical page data and the second logical page data that are provided to the memory device are removed from the buffer memory.

18. The memory system according to claim 16, wherein the program operation includes an intermediate program operation of storing any one of the plurality of pieces of first logical page data in the first physical page and a final program operation of storing remaining logical page data, among the plurality of pieces of first logical page data, in the first physical page.

19. The memory system according to claim 16, wherein the memory device further includes:
- first data latches configured to store the plurality of pieces of first logical page data to be stored in the first physical page; and
- a second data latch configured to store the second logical page data to be stored in the second physical page.

20. The memory system according to claim 19, wherein the second data latch stores the second logical page data since a main verify operation for a threshold program state, among target program states of memory cells included in the first physical page, has passed.

21. A page buffer, comprising:
- data latches configured to respectively store a plurality of pieces of first logical page data to be stored in a first physical page;
- a main sensing latch configured to store result information of a main verify operation; and
- a pre-sensing latch configured to store result information of a pre-verify operation,
- wherein, in response to a program suspend command,
- any one of the data latches transfers any one of the plurality of pieces of first logical page data to the pre-sensing latch, and
- the main sensing latch reflects the result information of the main verify operation in the plurality of pieces of first logical page data and stores data sensed through a read operation.

22. The page buffer according to claim 21, further comprising:
- a cache latch configured to output the sensed data to an external memory controller.

23. The page buffer according to claim 22, wherein the pre-sensing latch transfers the one piece of first logical page data to the cache latch in response to a program resume command.

24. The page buffer according to claim 23, wherein the cache latch provides the one piece of first logical page data to an external memory controller in response to a failure of a program operation of storing the plurality of pieces of first logical page data in the first physical page.

25. The page buffer according to claim 23, wherein the data latches are configured to, when the main verify operation for threshold program states, among target program states of memory cells included in the first physical page, has passed, respectively store a plurality of pieces of second logical page data to be stored in the second physical page.

26. The page buffer according to claim 21, wherein the pre-sensing latch transfers the one piece of first logical page data to any one of the cache latches in response to a program resume command.

27. The page buffer according to claim 26, wherein the one piece of first logical page data, stored in the data latches, and logical page data, in which the result information of the main verify operation is reflected, are used to resume a final program operation of increasing a threshold voltage of each of memory cells included in the first physical page to a threshold voltage corresponding to a target program state in response to the program resume command.

28. The page buffer according to claim 26, wherein an additional one of the data latches is configured to, when the main verify operation for a threshold program state, among target program states of memory cells included in the first physical page, has passed, store any one of a plurality of pieces of second logical page data to be stored in the second physical page.

29. The page buffer according to claim 28, wherein program states having threshold voltages higher than that in the threshold program state among the target program states are program states programmed using an additional one of the plurality of pieces of first logical page data.

30. The page buffer according to claim 28, wherein the threshold program state is a target program state having a highest threshold voltage among the target program states.

* * * * *